US009363924B2

(12) United States Patent
Campbell et al.

(10) Patent No.: US 9,363,924 B2
(45) Date of Patent: Jun. 7, 2016

(54) GROUND-BASED HEAT SINK FACILITATING ELECTRONIC SYSTEM COOLING

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 557 days.

(21) Appl. No.: 13/780,538

(22) Filed: Feb. 28, 2013

(65) Prior Publication Data
US 2014/0124164 A1    May 8, 2014

Related U.S. Application Data

(63) Continuation of application No. 13/671,829, filed on Nov. 8, 2012.

(51) Int. Cl.
*F28D 15/06* (2006.01)
*H05K 7/20* (2006.01)
(Continued)

(52) U.S. Cl.
CPC ............ *H05K 7/2039* (2013.01); *F24J 3/086* (2013.01); *F28D 15/0266* (2013.01); *F28D 15/0275* (2013.01); *H05K 7/20827* (2013.01); *Y02E 10/10* (2013.01); *Y02E 10/16* (2013.01)

(58) Field of Classification Search
CPC ............ H05K 7/2039; H05K 7/20654; H05K 7/2069; H05K 7/20745; H05K 7/20827; H05K 7/20281; H05K 7/20381; H05K 7/20836; H05K 7/207; F24J 3/08; F24J 3/081; F24J 3/084; F24J 3/086; F28D 15/0266; F28D 15/06
USPC .......................................................... 165/297
See application file for complete search history.

(56) References Cited

U.S. PATENT DOCUMENTS

| 3,782,132 A | 1/1974 | Lohoff et al. |
| 3,911,683 A | 10/1975 | Wolf et al. |

(Continued)

FOREIGN PATENT DOCUMENTS

| CN | 2020746393 U | 12/2011 |
| EP | 2124518 A1 | 11/2009 |

(Continued)

OTHER PUBLICATIONS

Campbell et al., Notice of Allowance for U.S. Appl. No. 13/671,829, filed Nov. 8, 2012 (U.S. Patent Publication No. 2014/0124163 A1) dated Sep. 23, 2015 (8 pages).

(Continued)

*Primary Examiner* — Judy Swann
*Assistant Examiner* — John Higgins
(74) *Attorney, Agent, or Firm* — Steven Chiu, Esq.; Kevin P. Radigan, Esq.; Heslin Rothenberg Farley & Mesiti P.C.

(57) ABSTRACT

Cooling methods are provided which include providing a heat sink having a housing with a compartment, a coolant inlet, and a coolant outlet. The housing is configured for a coolant to flow from the coolant inlet through the compartment to the coolant outlet, wherein the coolant is transferring heat extracted from one or more electronic components. The heat sink further includes one or more heat pipes having a first portion disposed within the compartment of the housing and a second portion disposed outside the housing. The heat pipe(s) is configured to extract heat from the coolant flowing through the compartment, and to transfer the extracted heat to the second portion disposed outside the housing. The second portion outside the housing is disposed to facilitate conducting the extracted heat into the ground.

6 Claims, 20 Drawing Sheets

(51) Int. Cl.
*F24J 3/08* (2006.01)
*F28D 15/02* (2006.01)

(56) References Cited

U.S. PATENT DOCUMENTS

| | | | |
|---|---|---|---|
| 4,237,963 A | 12/1980 | Girard | |
| 4,258,780 A | 3/1981 | Suo | |
| 4,346,569 A | 8/1982 | Yuan et al. | |
| 4,412,426 A | 11/1983 | Yuan | |
| 4,466,256 A | 8/1984 | MacCracken et al. | |
| 4,537,247 A | 8/1985 | Okamoto et al. | |
| 4,899,810 A | 2/1990 | Fredley | |
| 4,921,039 A | 5/1990 | Ghiraldi et al. | |
| 4,921,043 A | 5/1990 | Ghiraldi et al. | |
| 5,884,693 A | 3/1999 | Austin et al. | |
| 6,538,883 B1 | 3/2003 | Greer | |
| 6,691,766 B1 | 2/2004 | Azar | |
| 6,775,137 B2 | 8/2004 | Chu et al. | |
| 7,791,882 B2 | 9/2010 | Chu et al. | |
| 8,839,848 B2 | 9/2014 | Wu et al. | |
| 2004/0188059 A1 | 9/2004 | Todd et al. | |
| 2008/0266726 A1 | 10/2008 | Murakami et al. | |
| 2008/0307806 A1 | 12/2008 | Campbell et al. | |
| 2011/0042057 A1 | 2/2011 | Li et al. | |
| 2011/0247348 A1 | 10/2011 | Mashiko et al. | |
| 2012/0090808 A1* | 4/2012 | Scofield | H05K 7/2069 165/45 |
| 2013/0081781 A1 | 4/2013 | Chainer et al. | |
| 2013/0340994 A1 | 12/2013 | David et al. | |
| 2014/0124163 A1 | 5/2014 | Campbell et al. | |

FOREIGN PATENT DOCUMENTS

| | | |
|---|---|---|
| FR | 2487954 A1 | 2/1982 |
| JP | 1-200193 A | 8/1989 |
| JP | 2010-98063 A | 4/2010 |

OTHER PUBLICATIONS

Campbell et al., Office Action for U.S. Appl. No. 13/671,829, filed Nov. 8, 2012 (U.S. Patent Publication No. 2014/0124163 A1), dated May 6, 2015 (10 pages).

Campbell et al., "Controlled Cooling of an Electronic System for Reduced Energy Consumption", U.S. Appl. No. 13/527,863, filed Jun. 20, 2012.

Campbell et al., "Ground-Based Heat Sink Facilitating Electronic System Cooling", U.S. Appl. No. 13/671,829, filed Nov. 8, 2012.

* cited by examiner

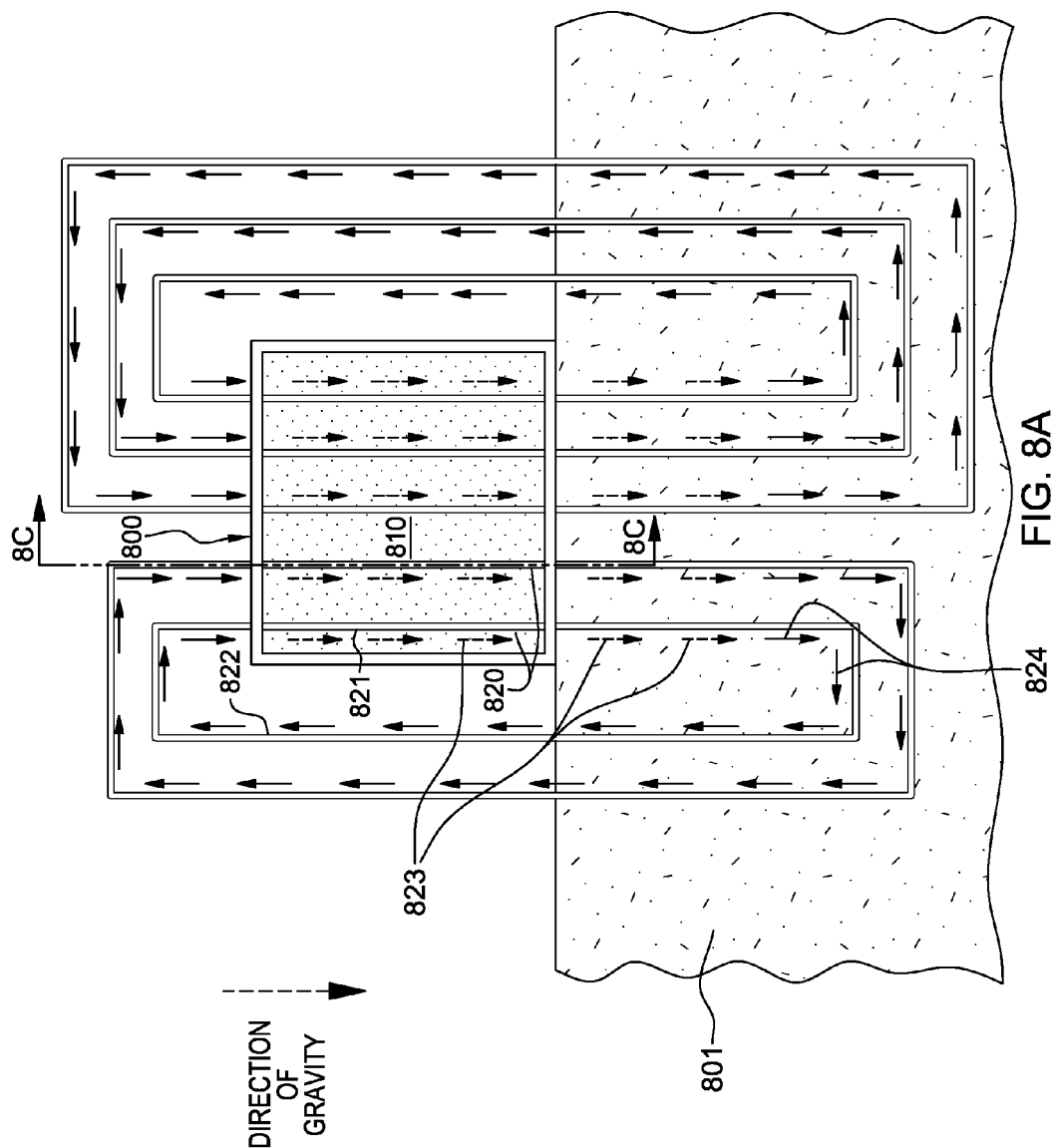

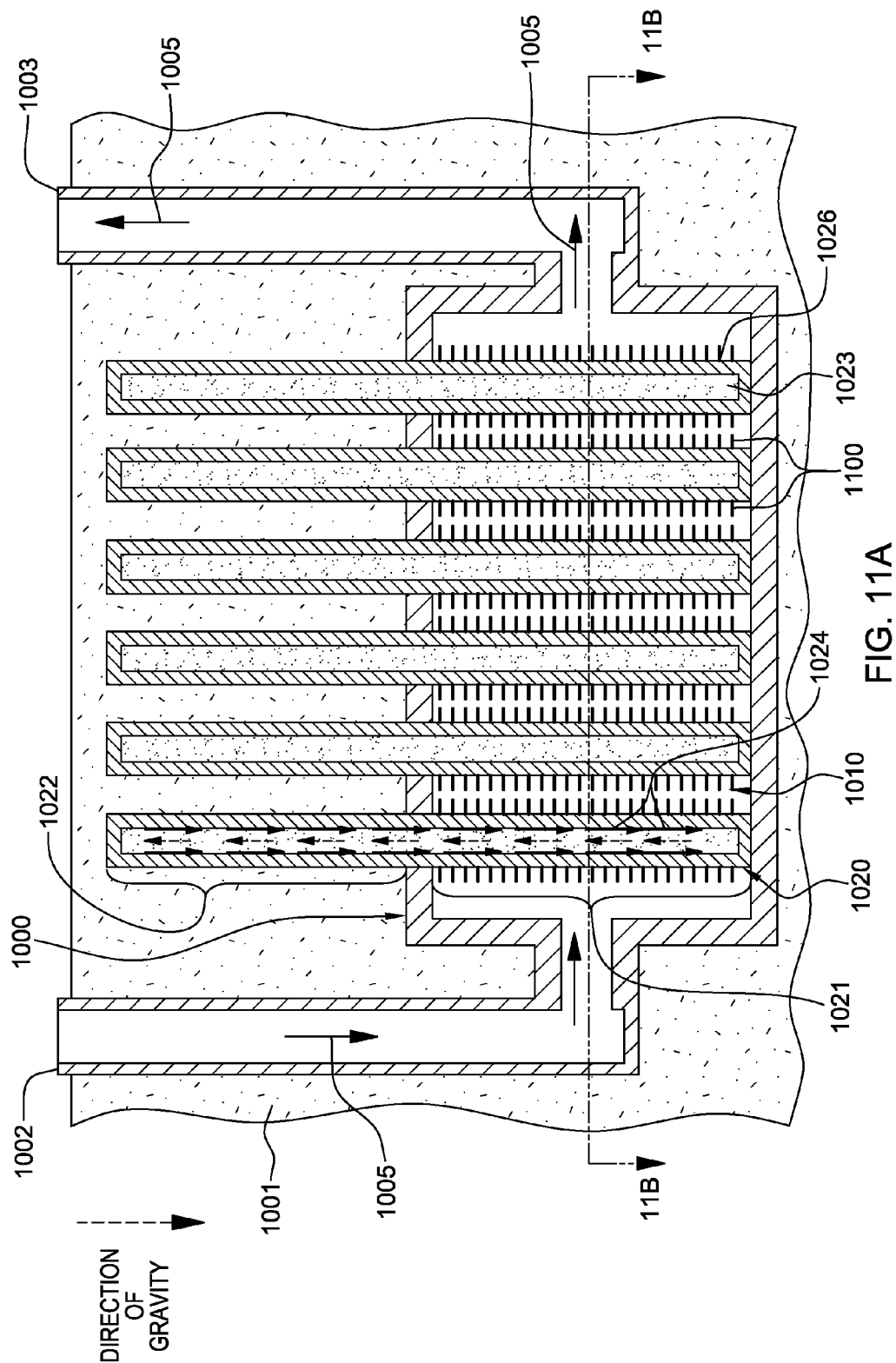

GROUND-BASED HEAT SINK FACILITATING ELECTRONIC SYSTEM COOLING

CROSS-REFERENCE TO RELATED APPLICATION

This application is a continuation of U.S. Ser. No. 13/671,829, filed Nov. 8, 2012, and entitled "Ground-Based Heat Sink Facilitating Electronic System Cooling", and which is hereby incorporated herein by reference in its entirety.

BACKGROUND

As is known, operating electronic components, such as electronic devices, produce heat. This heat should be removed from the devices in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. For example, power dissipation, and therefore heat production, increases as device operating frequencies increase. Also, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices, and electronic system containing such devices, solely by traditional air cooling methods, such as by using air cooled heat sinks with heat pipes or vapor chambers. Such air cooling techniques are inherently limited in their ability to extract heat from electronic components with moderate to high power density.

BRIEF SUMMARY

In one aspect, the shortcomings of the prior art are overcome and additional advantages are provided through a method which includes: providing a ground-based heat sink controllably coupled to a coolant loop, the ground-based heat sink being at least partially buried in the ground and being configured to transfer heat from coolant passing therethrough into the ground; providing a coolant-to-air heat rejection unit controllably coupled to the coolant loop, the coolant-to-air heat rejection unit being configured to reject heat from coolant passing therethrough to air passing across the coolant-to-air heat rejection unit; and providing a controller to selectively control flow of coolant within the coolant loop through the ground-based heat sink and through the coolant-to-air heat rejection unit based, at least in part, on at least one monitored variable.

In another aspect, a method is provided which includes: providing a heat sink, the heat sink comprising: a housing including a compartment, a coolant inlet, and a coolant outlet, the housing being configured for a coolant to flow from the coolant inlet through the compartment to the coolant outlet, the coolant transferring heat extracted from one or more electronic components; and at least one heat pipe comprising a first portion disposed within the compartment of the housing, and a second portion disposed outside the housing, the at least one heat pipe being configured to extract heat from the coolant flowing through the compartment, and to transfer the extracted heat to the second portion disposed outside the housing, wherein the second portion of the at least one heat pipe outside the housing is disposed to facilitate conducting the extracted heat into the ground Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8A is a schematic of one embodiment of a ground-based heat sink for a cooling system such as depicted in FIG. 7, in accordance with one or more aspects of the present invention;

FIG. 11A is a cross-sectional elevational view of a yet further embodiment of a ground-based heat sink, taken along line 11A-11A in the plan view of FIG. 11B, in accordance with one or more aspects of the present invention;

DETAILED DESCRIPTION

Figure 1A:
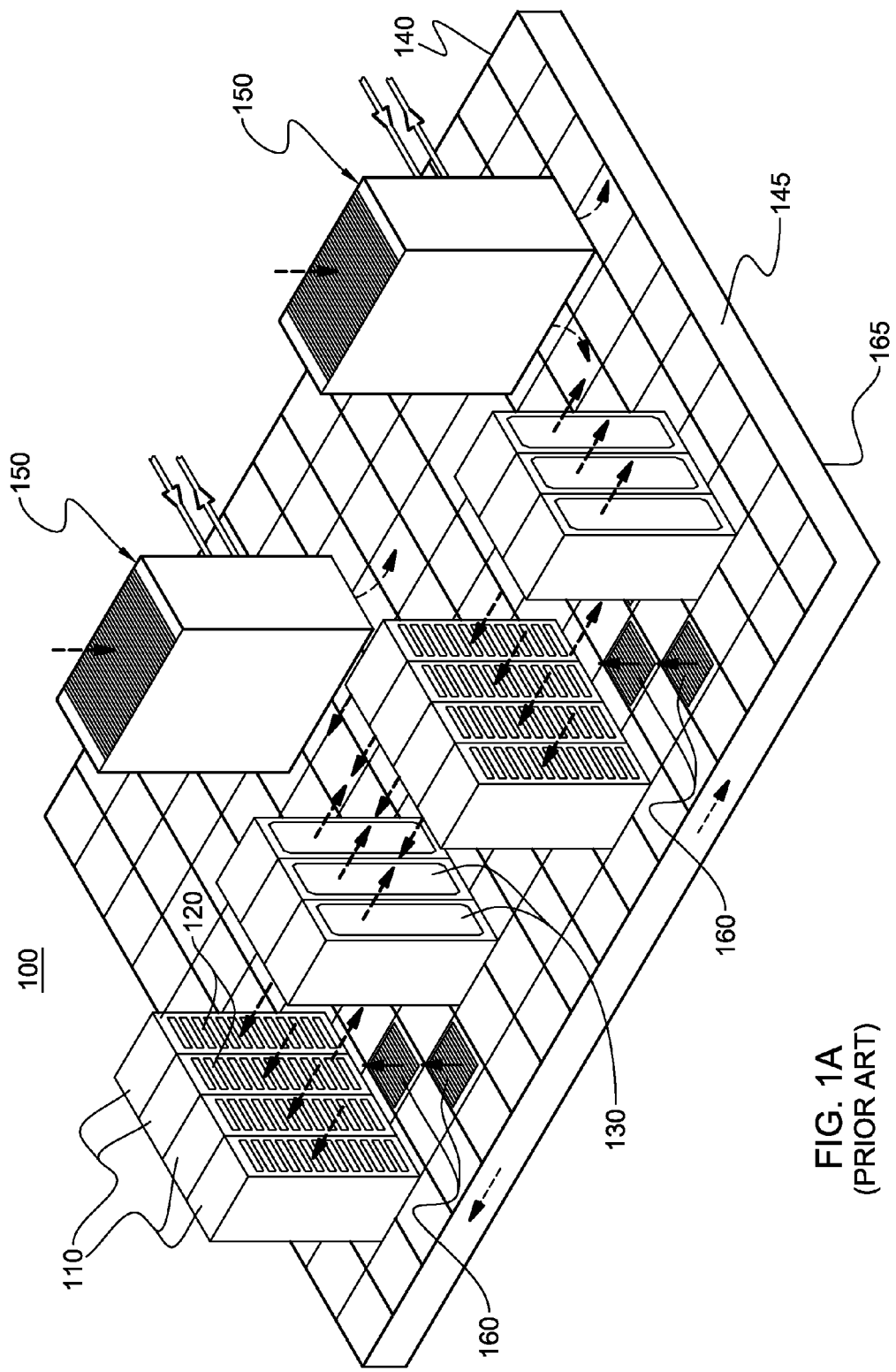
FIG. 1A depicts one embodiment of a conventional raised floor layout of an air-cooled data center.

As used herein, the terms "electronics rack", and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) may be movable or fixed, for example, relative to an electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards. In one implementation, an electronics card may comprise a plurality of memory modules (such as one or more dual in-line memory modules (DIMMs)).

Further, as used herein, the terms "coolant-cooled structure", "coolant-cooled cold plate" and "coolant-cooled cold rail" refer to structures having one or more channels (or passageways) formed therein or passing therethrough, which facilitate the flow of coolant (such as liquid coolant) through the structure. A coolant-cooled structure may be, for example, a coolant-cooled cold plate, or a coolant-cooled cold rail, or a coolant manifold. In one example, tubing is provided extending through the coolant-cooled structure. An "air-to-liquid heat exchanger" or "liquid-to-air heat exchanger" means any heat exchange mechanism characterized as described herein through which liquid coolant can circulate; and includes, one or more discrete heat exchangers coupled either in series or in parallel. A heat exchanger may comprise, for example, one or more coolant flow paths, formed of thermally conductive tubing (such as copper or other tubing) in thermal or mechanical contact with a plurality of air-cooled cooling fins. Size, configuration and construction of the heat exchanger can vary without departing from the scope of the invention disclosed. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Still further, "data center" refers to a computer installation containing one or more electronics racks to be cooled. As a specific example, a data center may comprise one or more rows of rack-mounted computer units, such as server units.

By way of further explanation, a "heat pipe" is a heat transfer device which combines the principles of both thermal conductivity and phase transition to effectively manage the transfer of heat. A simply type of heat pipe includes a sealed case, an inner surface of which is covered with a layer of capillary or porous material, or structure comprising a wick which is saturated with the working fluid in its liquid phase. At a hot interface within the heat pipe, which may be at a low pressure, a working fluid within the heat pipe in contact with a thermally conductive surface (for example, an inner wall of the casing or a wick), turns into a vapor by absorbing heat from that surface. The working fluid vapor condenses back into a liquid at a cold interface of the heat pipe, releasing the latent heat. The working fluid liquid then returns to the hot interface through, for example, the wick structure by capillary action or gravity, where it evaporates once more and repeats the cycle. Internal pressure within the heat pipe can be set or adjusted to facilitate the phase change, depending on the demands of the working conditions of the cooling system.

One example of coolant used within the cooling systems and cooled electronic systems disclosed herein is water. However, the concepts presented are readily adapted to use with other types of coolant. For example, unless otherwise specified, the coolant may comprise a brine, a glycol mixture, a fluorocarbon liquid, or other coolant, or refrigerant, while still maintaining the advantages and unique features of the present invention.

Reference is made below to the drawings (which are not drawn to scale for ease of understanding), wherein the same reference numbers used throughout different figures designate the same or similar components.

FIG. 1A depicts a raised floor layout of an air cooled data center 100 typical in the prior art, wherein multiple electronics racks 110 are disposed in one or more rows. A data center such as depicted in FIG. 1A may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more computer room air-conditioning (CRAC) units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 1B:
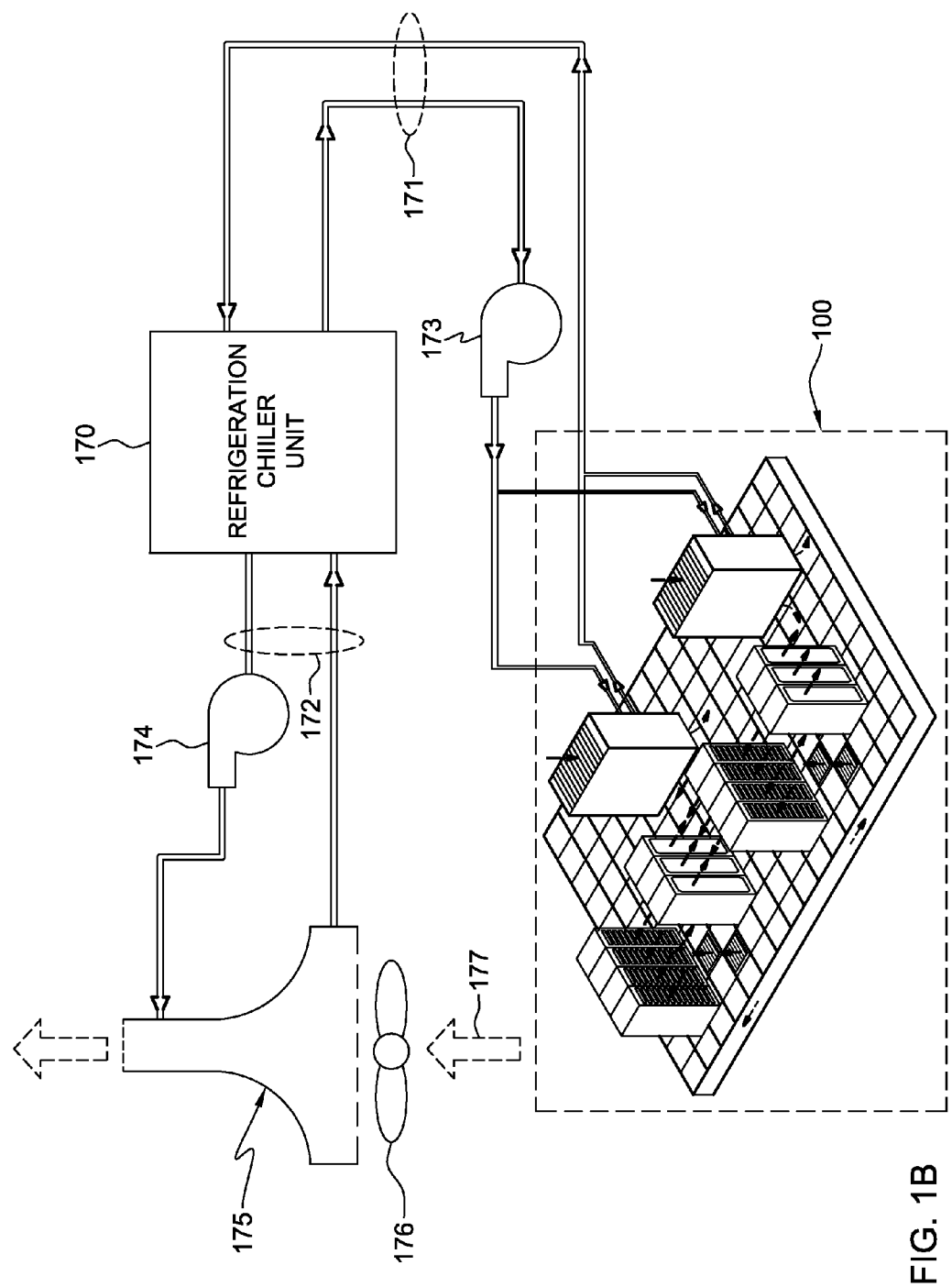
FIG. 1B depicts one embodiment of a cooling facility for an air-cooled data center such as depicted in FIG. 1A.

FIG. 1B depicts one embodiment of facility-level cooling to facilitate heat transfer from the electronics racks of the data center 100 to ambient outdoor air 177 being drawn via one or more air-moving devices 176 through a cooling tower 175, such as a wet cooling tower. As described above in connection with FIG. 1A, data center 100 includes one or more electronics (or IT) racks arranged in one or more rows to form aisles. Chilled air enters the floor via, for example, one or more perforated floor tiles, passes through the racks, becomes heated in the process, and then is drawn to the intake of a computer room air-conditioning unit disposed within data center 100. The computer room air-conditioning unit cools the hot air and provides the chilled air to the underfloor plenum. In one embodiment, the computer room air-conditioning units are chilled via facility coolant coupled to a facility coolant loop 171 connecting in fluid communication a refrigeration chiller unit 170 and the computer room air-conditioning units of data center 100. The chilled facility coolant, such as chilled water, allows the computer room air-conditioning units to supply chilled air to the underfloor plenum of the data center, typically in the 15° C.-32° C. range, with 24° C.-27° C. being the long-term recommended temperature band.

Figure 2:
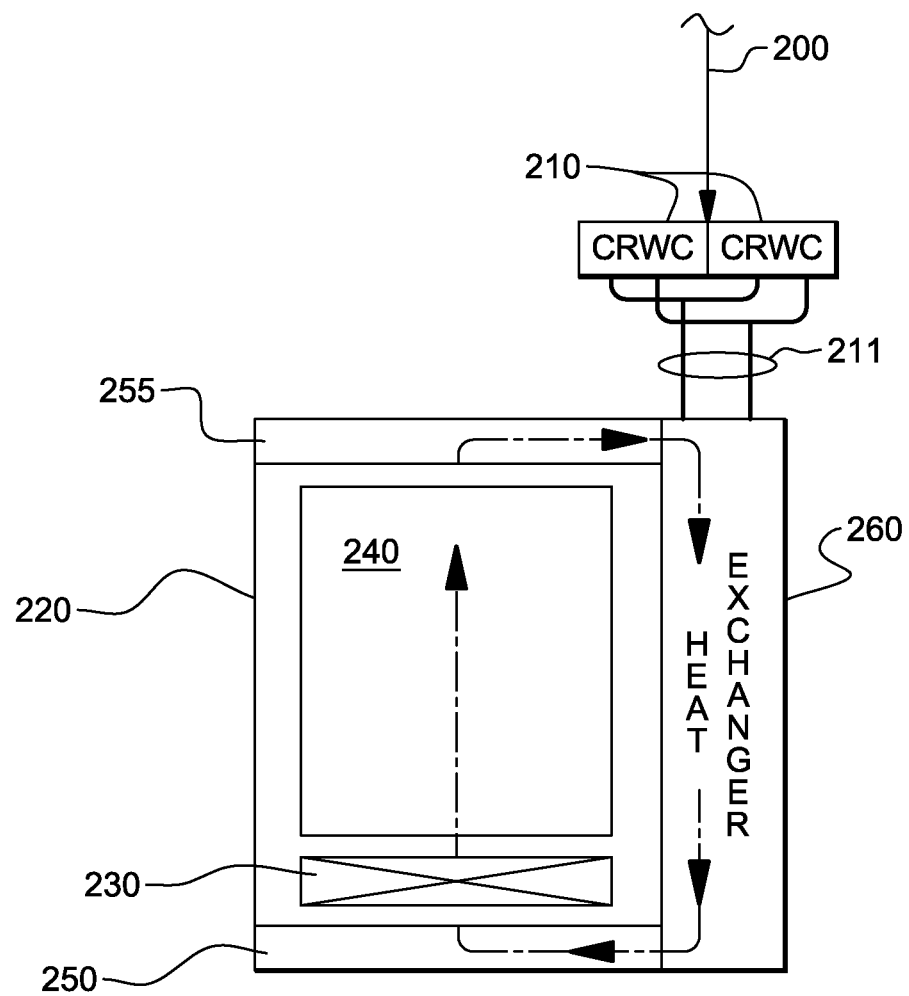
FIG. 2 is a cross-sectional plan view of one embodiment of an electronics rack with an attached air-to-liquid heat exchanger enhancing cooling of air passing through the electronics rack.
Figure 3:
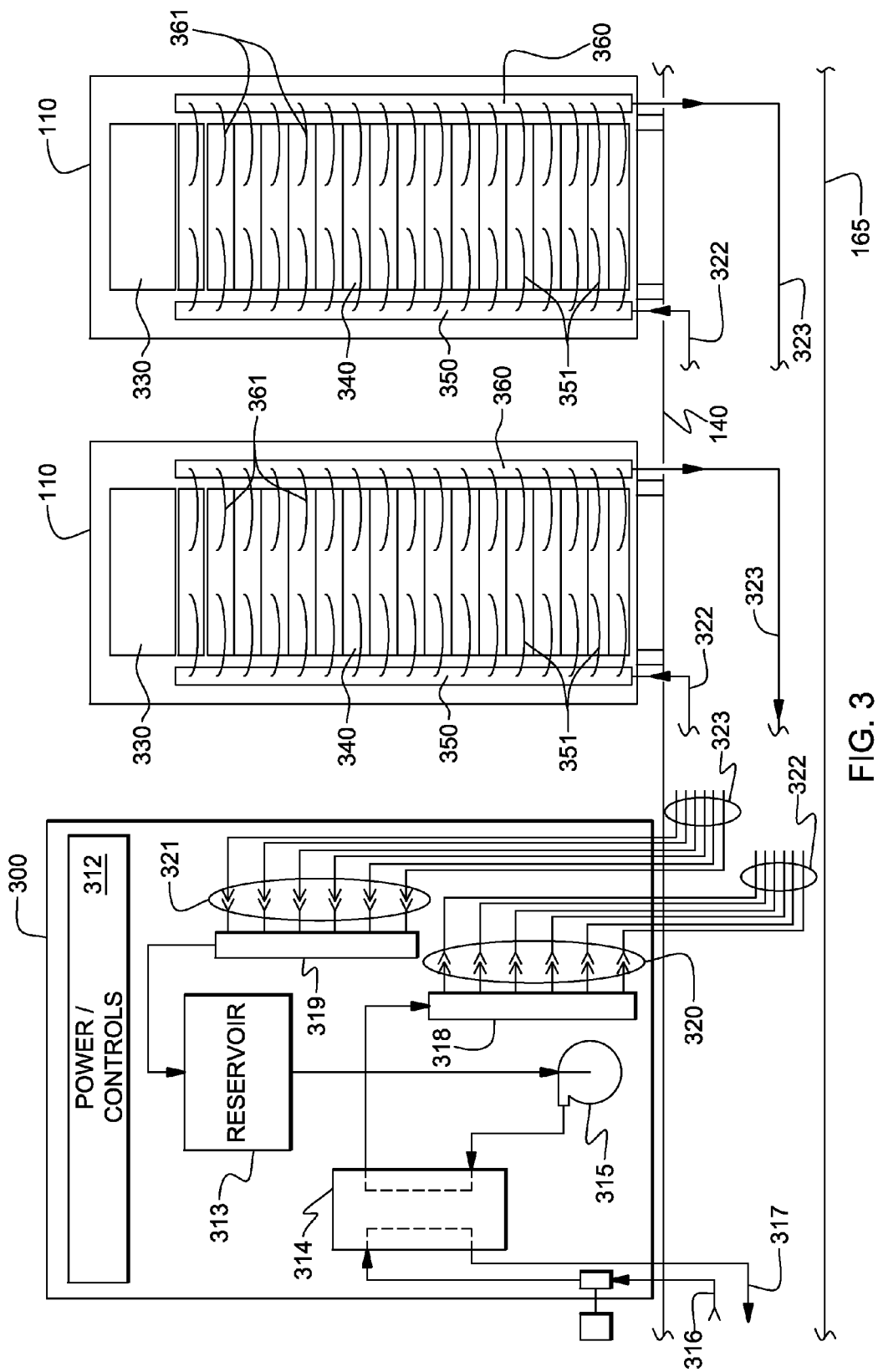
FIG. 3 depicts one embodiment of a data center with a coolant distribution unit facilitating liquid-cooling of one or more coolant-cooled electronics racks of the data center, in accordance with one or more aspects of the present invention.
Figure 4:
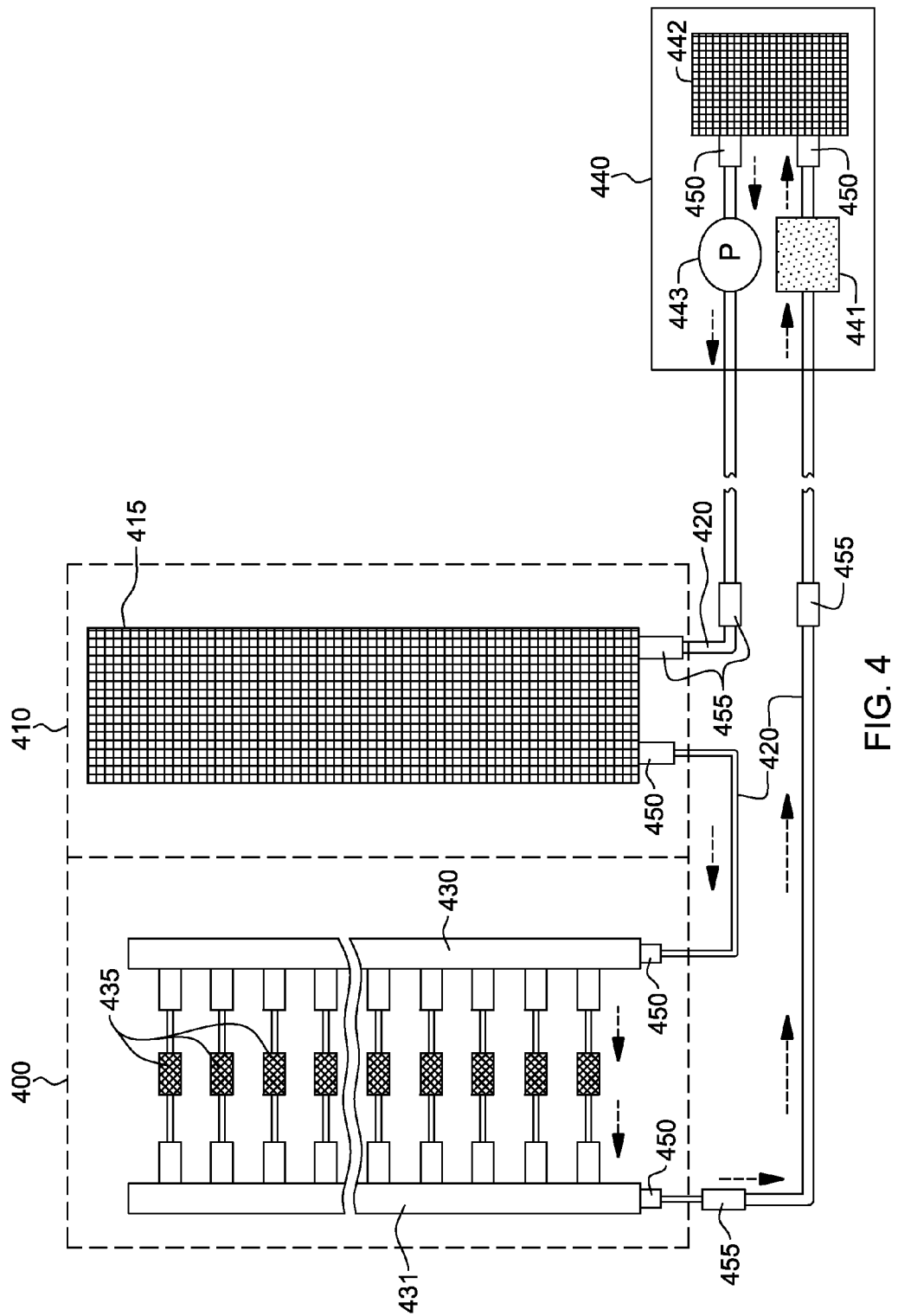
FIG. 4 depicts an alternate embodiment of a cooling system and coolant-cooled electronics system, in accordance with one or more aspects of the present invention.

Due to ever-increasing air flow requirements through electronics racks, and the limits of air distribution within a typical data center installation, liquid-coolant-based cooling is being combined with conventional air-cooling. FIGS. 2-4 illustrate various embodiments of a data center implementation employing such a coolant-based cooling system.

FIG. 2 depicts one rack-level coolant-cooling solution which utilizes (by way of example) chilled facility water to remove heat from the computer installation room, thereby transferring the cooling burden from the air-conditioning unit(s) to the building's chilled water coolers. The embodiment depicted in FIG. 2 is described in detail in commonly assigned, U.S. Pat. No. 6,775,137. Briefly summarized, facility-chilled water 200 circulates through one or more liquid-to-liquid heat exchangers 210, coupled via a system coolant loop 211, to individual electronics racks 220 within the computer room. Rack unit 220 includes one or more air-moving devices 230 for moving air flow from an air inlet side to an air outlet side across one or more drawer units 240 containing heat-generating electronic components to be cooled. In this embodiment, a front cover 250 attached to the rack covers the air inlet side, a back cover 255 attached to the rack covers the air outlet side, and a side car disposed adjacent to (and/or attached to) the rack includes a heat exchanger 260 for cooling air circulating through the rack unit. Further, in this embodiment, the liquid-to-liquid heat exchangers 210 are multiple computer room water-conditioning (CRWC) units which are coupled to receive building chilled facility water 200. The building chilled facility water is used to cool the system coolant within system coolant loop 211, which is circulating through air-to-liquid heat exchanger 260. The rack unit in this example is assumed to comprise a substantially enclosed housing, wherein the same air circulates through the housing that passes across the air-to-liquid heat exchanger 260. In this manner, heat generated within the electronics rack is removed from the enclosed housing via the system coolant loop, and transferred to the facility coolant loop for removal from the computer installation room.

FIG. 3 depicts another embodiment of a rack-level, coolant-cooling solution, which again uses chilled facility water to remove heat from the computer installation room, thereby transferring the cooling burden from the air-conditioning unit(s) to the building's chilled water coolers. In this implementation, one embodiment of a coolant distribution unit 300 for a data center is illustrated. Within coolant distribution unit 300 is a power/control element 312, a reservoir/expansion tank 313, a liquid-to-liquid heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water or system coolant from the electronics racks 110, via lines 323 and couplings 321. Each electronics rack includes (in one example) a power/control unit 330 for the electronics rack, multiple electronic systems or subsystems 340, a system coolant supply manifold 350, and a system coolant return manifold 360. As shown, each electronics rack 110 is disposed on raised floor 140 of the data center with lines 322 providing system coolant to system coolant supply manifolds 350 and lines 323 facilitating return of system coolant from system coolant return manifolds 360 being disposed in the supply air plenum beneath the raised floor.

In the embodiment illustrated, system coolant supply manifold 350 provides system coolant to cooling apparatuses disposed within the electronic systems or subsystems (for example, to coolant-cooled cold plates or cold rails) via flexible hose connections 351, which are disposed between the supply manifold and the respective electronic systems within the rack. Similarly, system coolant return manifold 360 is coupled to the electronic systems via flexible hose connections 361. Quick connect couplings may be employed at the interface between flexible hoses 351, 361 and the individual electronic systems. By way of example, these quick connect couplings may comprise various types of commercially available quick connect/disconnect couplings.

Although not shown, electronics rack 110 may also include an air-to-coolant heat exchanger, for example, disposed at an air outlet side thereof, which also receives system coolant from the system coolant supply manifold 350 and returns system coolant to the system coolant return manifold 360.

FIG. 4 illustrates another embodiment of a coolant-cooled electronics rack and cooling system therefor, in accordance with one or more aspects of the present invention. In this embodiment, the electronics rack 400 has a side car structure 410 associated therewith or attached thereto, which includes an air-to-liquid heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizer-based, warm-liquid coolant loop 420, which comprises multiple coolant tubes (or lines) connecting, in the example depicted, air-to-liquid heat exchanger 415 in series fluid communication with a coolant supply manifold 430 associated with electronics rack 400, and connecting in series fluid communication, a coolant return manifold 431 associated with electronics rack 400, a cooling unit 440 of the cooling system, and air-to-coolant heat exchanger 415.

As illustrated, coolant flowing through warm-liquid coolant loop 420, after circulating through air-to-liquid heat exchanger 415, flows via coolant supply plenum 430 to one or more electronic systems of electronics rack 400, and in particular, one or more cold plates and/or cold rails 435 associated with the electronic systems, before returning via coolant return manifold 431 to warm-liquid coolant loop 420, and subsequently to a cooling unit 440 disposed (for example) outdoors from the data center. In the embodiment illustrated, cooling unit 440 includes a filter 441 for filtering the circulating coolant, a heat exchanger 442 for removing heat from the coolant, and a pump 443 for returning the coolant through warm-liquid coolant loop 420 to air-to-liquid heat exchanger 415, and subsequently to the coolant-cooled electronics rack 400. By way of example, hose barb fittings 450 and quick disconnect couplings 455 may be employed to facilitate assembly or disassembly of warm-liquid coolant loop 420.

In one example of the warm liquid-cooling approach of FIG. 4, ambient temperature might be 30° C., and coolant temperature 35° C. leaving the air-to-liquid heat exchanger 442 of the cooling unit. The cooled electronic system depicted thus facilitates a chiller-less data center. Advantageously, such a liquid-cooling solution provides highly energy efficient cooling of the electronic system(s) of the electronics rack, using coolant (e.g., water), that is cooled via circulation through the air-to-liquid heat exchanger located outdoors (i.e., a dry cooler) with external ambient air being pumped through the dry cooler. Note that this warm liquid-cooling approach of FIG. 4 is presented by way of example only. In alternate approaches, cold liquid-cooling could be substituted for the cooling unit 440 depicted in FIG. 4. Such cold liquid-cooling might employ building chilled facility coolant to cool the coolant flowing through the liquid-cooled electronics rack, and associated air-to-liquid heat exchanger (if present), in a manner such as described above in connection with FIGS. 2 & 3.

Figure 5B:
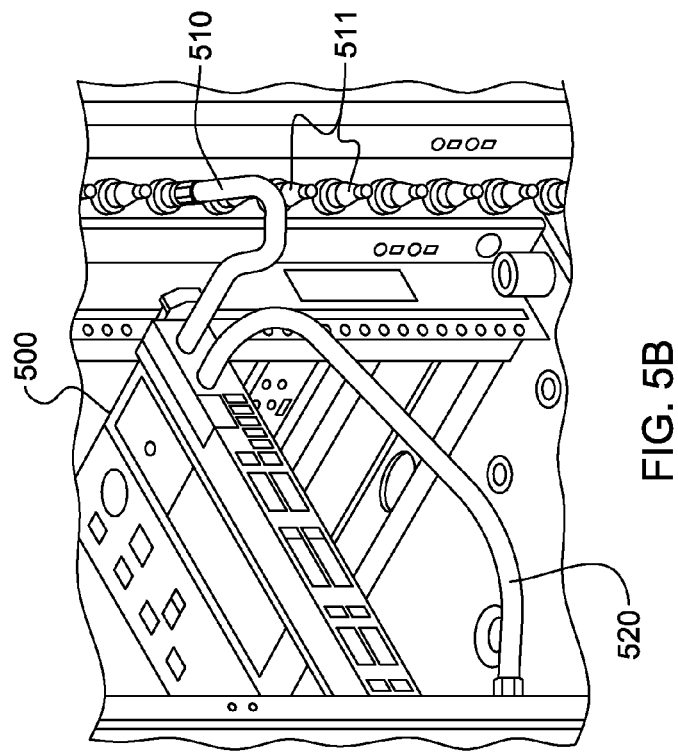
FIG. 5B is a partial depiction of a more detailed embodiment of the rack-level coolant distribution structures illustrated in FIG. 5A, in accordance with one or more aspects of the present invention.
Figure 5A:
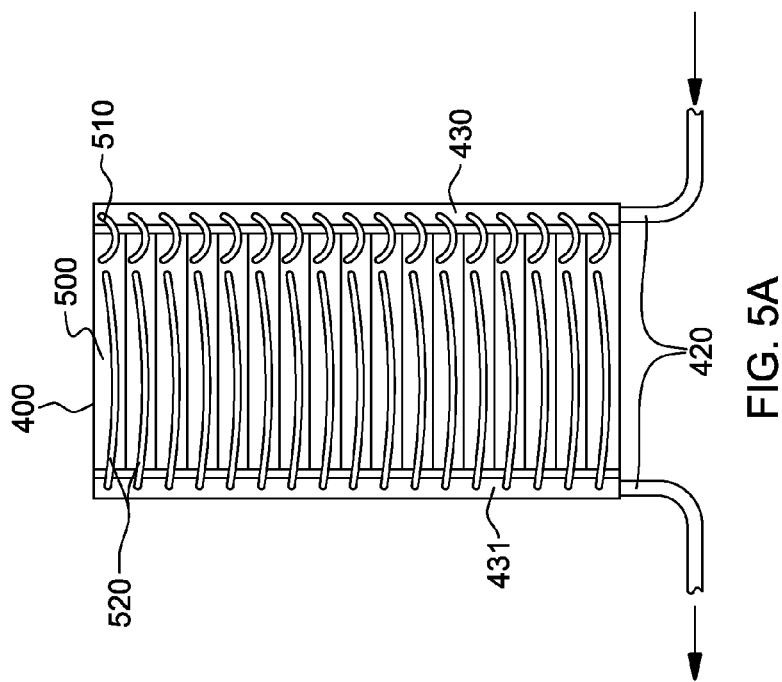
FIG. 5A is a more detailed, elevational view of one embodiment of the coolant-cooled electronics rack of FIG. 4, and illustrating rack-level coolant distribution structures, in accordance with one or more aspects of the present invention.

FIGS. 5A & 5B depict in greater detail one embodiment of a coolant-cooled electronics rack, such as depicted in FIG. 4, in accordance with one or more aspects of the present invention. In this implementation, coolant-cooled electronics rack 400 comprises a plurality of electronic systems 500, within which one or more electronic components are to be coolant-cooled via, for example, one or more cold plates or cold rails, as described below. The cooling system includes coolant loop 420 coupled in fluid communication with coolant supply manifold 430 and coolant return manifold 431, both of which may comprise vertically-oriented manifolds attached to coolant-cooled electronics rack 400. In this embodiment, the rack-level coolant distribution system further includes individual node-level supply hoses 510 supplying coolant from coolant supply manifold 430 to cold plates and cold rails within the electronic systems 500. As shown in FIG. 5B, coolant supply manifold 430 may be (in one embodiment) a vertically-oriented manifold with a plurality of coupling connections 511 disposed along the manifold, one for each electronic system 500 having one or more electronic components to be coolant-cooled. Coolant leaves the individual electronic systems 500 via node-level return hoses 520, which couple the individual electronic systems (or nodes) to coolant return manifold 431, and hence, to coolant loop 420. In the embodiment illustrated in FIG. 4, relatively warm coolant, such as water, is supplied from the cooling unit, either directly, or through one or more air-to-liquid heat exchanger(s) 415 (of FIG. 4), and hot coolant is returned via the coolant return manifold to the cooling unit. In one embodiment of the rack-level coolant distribution system illustrated in FIGS. 5A & 5B, the node-level supply and return hoses 510, 520 are flexible hoses.

Figure 6:
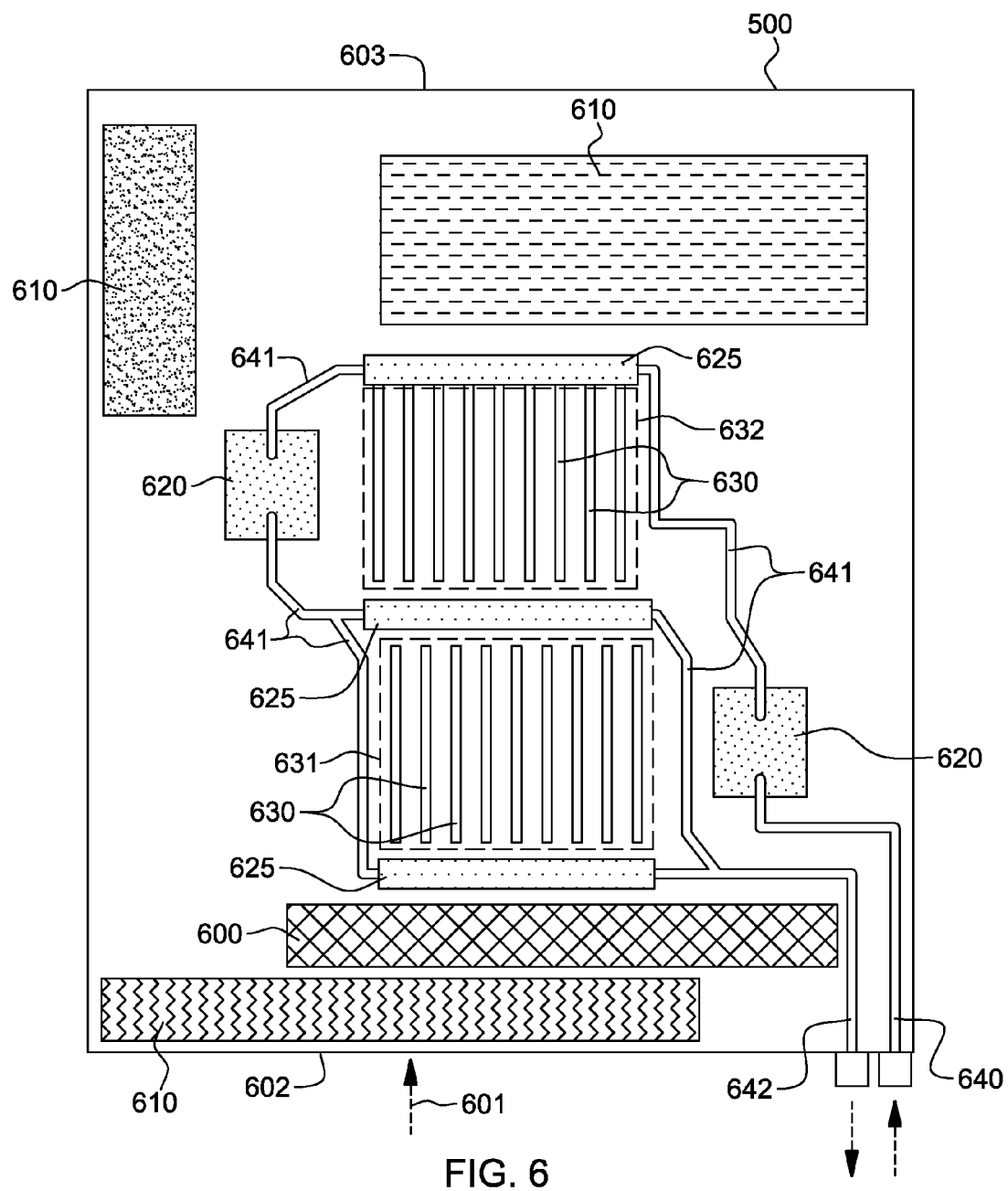
FIG. 6 is a plan view of one embodiment of an electronic system layout for a coolant-cooled electronics rack, and illustrating multiple coolant-cooled cold plates and multiple coolant-cooled cold rails coupled in fluid communication, in accordance with one or more aspects of the present invention.

FIG. 6 illustrates one embodiment of a cooled electronic system 500 component layout, wherein one or more air-moving devices 600 provide forced air flow 601 to cool multiple components 610 within electronic system 500. Cool air is taken in through a front 602 and exhausted out a back 603 of the electronic system (or drawer). The multiple components to be cooled include, for example, multiple processor modules to which coolant-cooled cold plates 620 (of the coolant-based cooling apparatus) are coupled, as well as multiple arrays 631, 632 of electronics cards 630 (e.g., memory modules such as dual in-line memory modules (DIMMs)), which are to be thermally coupled to one or more coolant-cooled cold rails 625. As used herein "thermally coupled" refers to a physical thermal transport path being established between components, for example, between an electronics card and a coolant-cooled cold rail for the conduction of heat from one to the other.

The illustrated coolant-based cooling approach further includes multiple coolant-carrying tubes connecting in fluid communication coolant-cooled cold plates 620 and coolant-cooled cold rails 625. These coolant-carrying tubes comprise (for example), a coolant supply tube 640, multiple bridge tubes 641, and a coolant return tube 642. In the embodiment illustrated, bridge tubes 641 connect one coolant-cooled cold rail 625 in series between the two coolant-cooled cold plates 620, and connect in parallel two additional coolant-cooled cold rails 625 between the second coolant-cooled cold plate 620 and the coolant return tube 642. Note that this configuration is provided by way of example only. The concepts disclosed herein may be readily adapted to use with various configurations of cooled electronic system layouts. Note also, that as depicted herein, the coolant-cooled cold rails are elongate, thermally conductive structures comprising one or more channels through which liquid coolant passes, for example, via one or more tubes extending through the structures. The coolant-cooled cold rails are disposed, in the embodiment illustrated, at the ends of the two arrays (or banks) 631, 632 of electronics cards 630, and multiple thermal spreaders are provided coupling in thermal communication electronics cards 630 and coolant-cooled cold rails 625.

Figure 7:
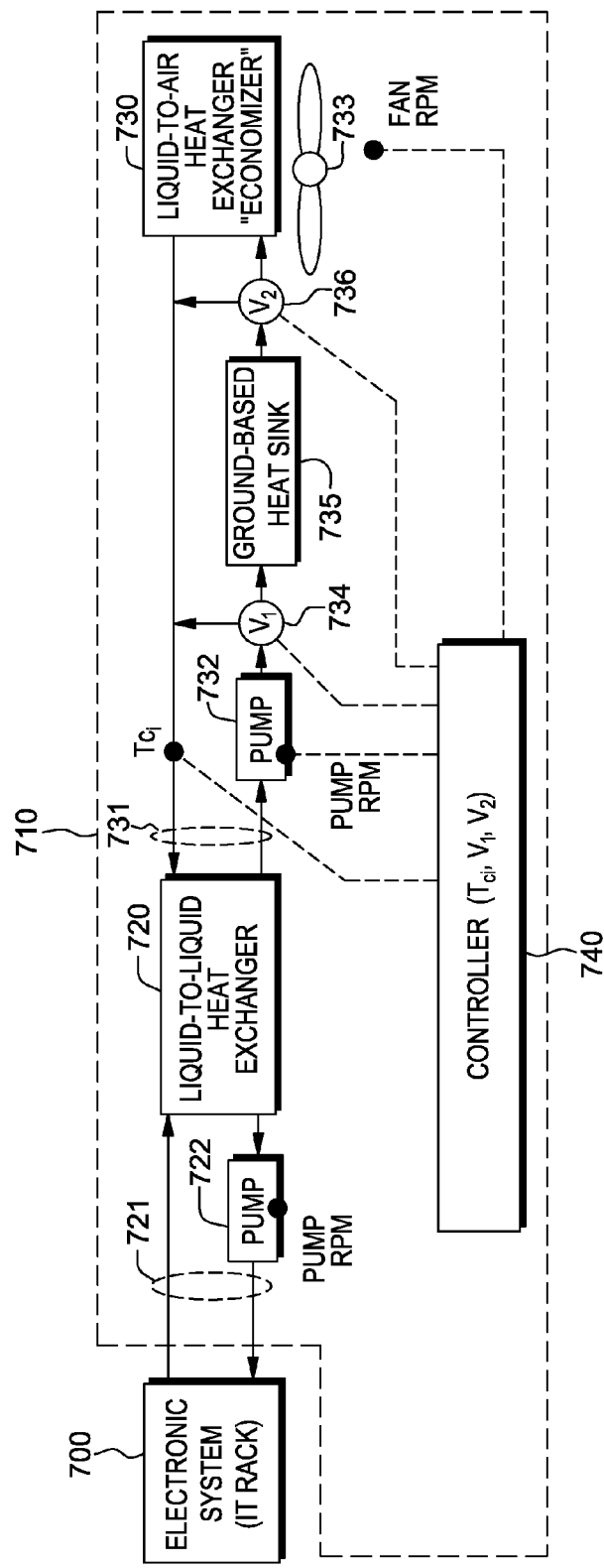
FIG. 7 is a schematic of another embodiment of a cooling system cooling one or more electronic components, systems, or racks of a data center, and including a heat sink providing selective, ground-based pre-cooling of coolant within the secondary coolant loop, in accordance with one or more aspects of the present invention.

FIG. 7 depicts an example of a cooled electronic system comprising a controller (or control system) implementing, in one aspect, cooling power consumption control. Note that as used herein, a controller or control system may comprise, by way of example, a computer or a programmable logic controller. The control system may include, for instance, a processor (e.g., a central processing unit), a memory (e.g., main memory), and multiple input/output (I/O connections), interfaces, devices, etc., coupled together by one or more busses and/or other connections. In one application, the controller or control system couples to a plurality of sensors, such as temperature and valve position sensors, as well as to one or more actuators for controlling, for instance, fan speed or position of one or more recirculation valves to (at least in part) minimize cooling power consumption, while maintaining one or more monitored variables within a set range. In one instance, the controller controls cooling power consumption to maintain coolant temperature within a coolant loop within a set range. Note that the input/output sense and control arrangements may be integrated within the controller or control system, or they may be external I/O modules or devices coupled to the controller, which facilitate the desired sensing and actuation functions.

The cooled electronic system depicted in FIG. 7 includes an electronic system (or rack) 700, which may comprise (by way of example) a liquid and air-cooled electronic system or rack, and optionally, an air-to-liquid heat exchanger (not shown). Electronic system 700 may include, for instance, one or more coolant-cooled structures and/or one or more air-to-liquid heat exchangers, such as described above in connection with FIGS. 2-6. The cooled electronic system further includes a cooling system 710 providing, for example, liquid coolant via a first, primary coolant loop 721 to electronic system (or rack) 700.

In the depicted embodiment, cooling system 710 may comprise a chiller-less cooling configuration in which 100% liquid-cooling is provided. The cooling system facilitates provision of a liquid that is cooled using a "dry" cooling tower or an active economizer, such as described further below.

Figure 12A:
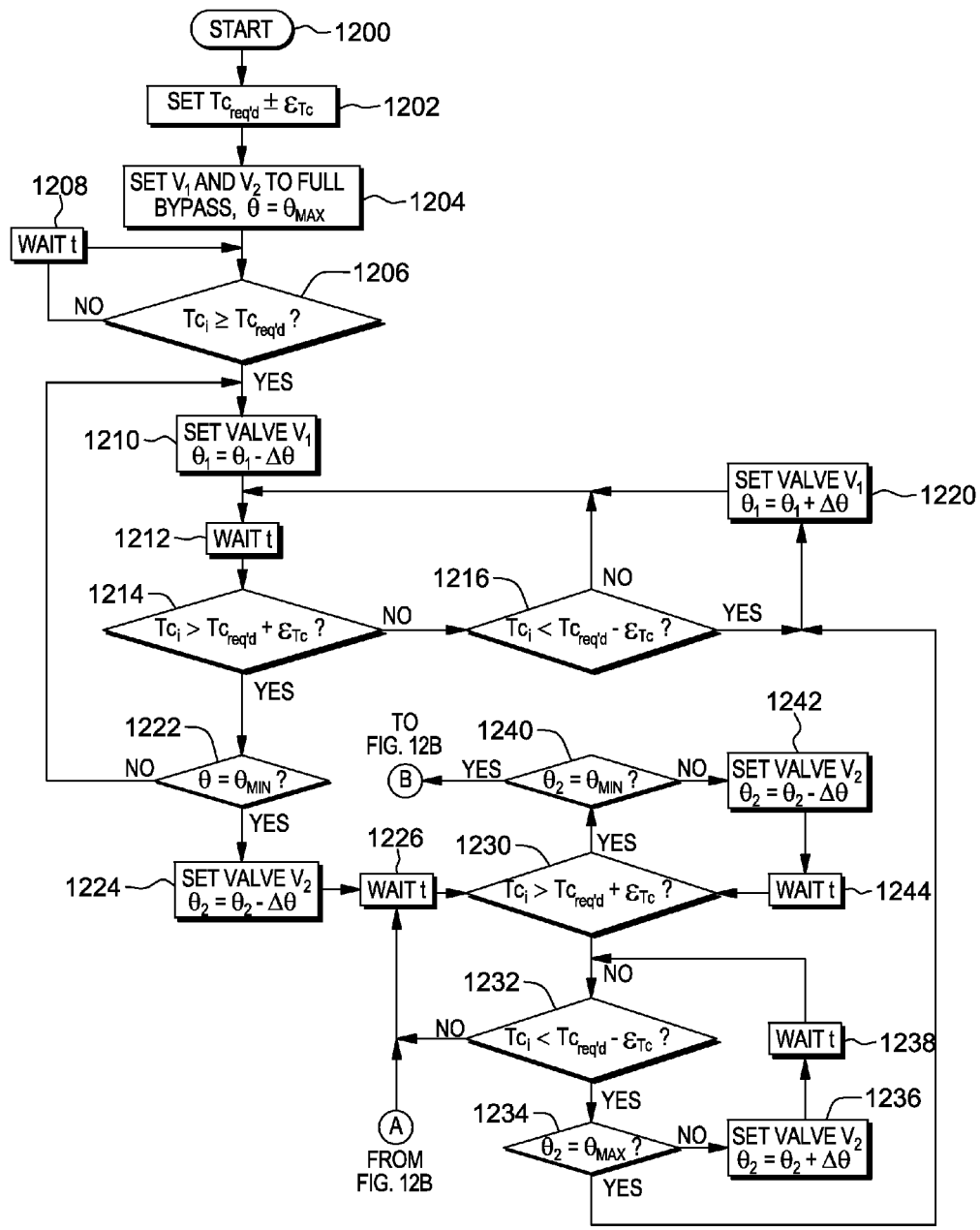
FIGS. 12A-12B are a flowchart of one embodiment of a process for controlling coolant flow within a coolant loop of a cooling system, such as the secondary coolant loop of the cooling system depicted in FIG. 7, which includes a ground-based heat sink and a coolant-to-air heat rejection unit, in accordance with one or more aspects of the present invention.
Figure 12B:
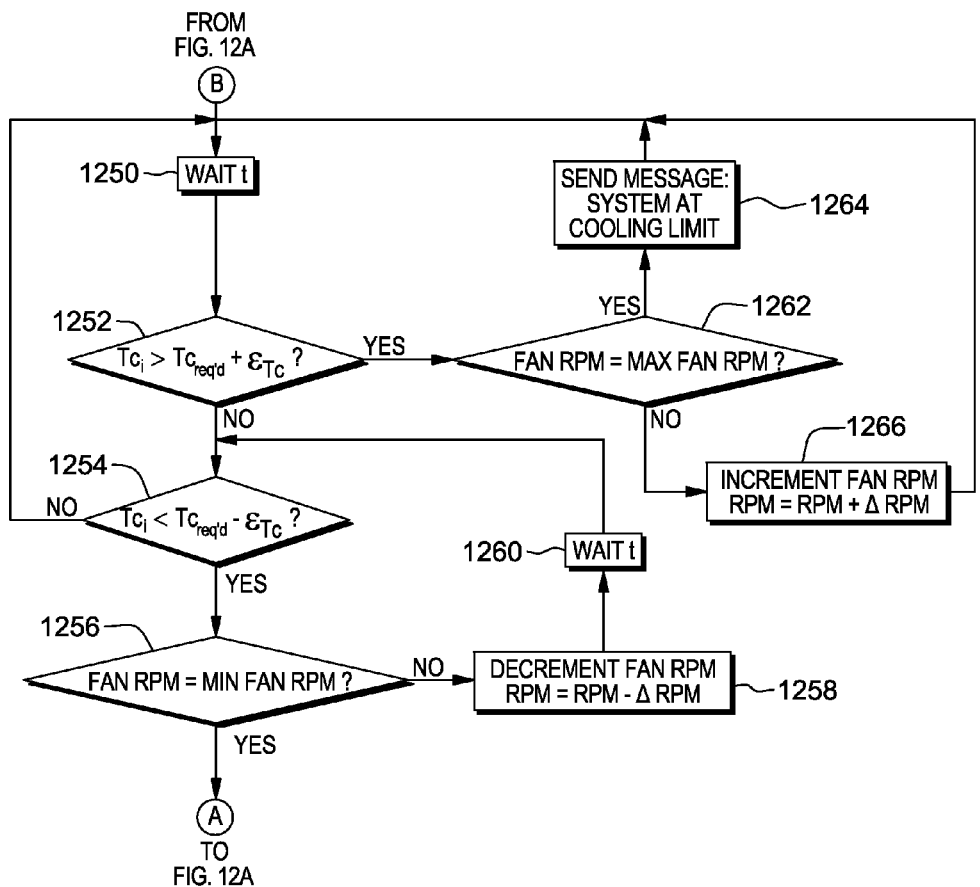

In the embodiment depicted, cooling system 710 includes a liquid-to-liquid heat exchanger 720, a liquid-to-air heat exchanger 730, and a ground-based heat sink 735. The primary coolant loop 721 couples in fluid communication with liquid-to-liquid heat exchanger 720, as does a secondary coolant loop 731, which couples in fluid communication liquid-to-liquid heat exchanger 720, ground-based heat sink 735, and liquid-to-air heat exchanger 730. In this embodiment, a first coolant pump 722 pumps coolant through primary coolant loop 721, and a second coolant pump 732 pumps coolant through secondary coolant loop 731. In addition, one or more air-moving devices, such as one or more fans 733, facilitates air movement across liquid-to-air heat exchanger 730, and multiple diverter valves 734, 736 are provided, which may be controllable three-way proportional valves with multiple regulation positions between an open position and a closed position. A controller 740, such as a programmable logic controller or a computer, implements (in one embodiment) the control system processing described herein. Controller 740 is coupled to control, for instance, one or more of fan(s) 733, diverter valve 734, and diverter valve 736, as well as (optionally) first coolant pump 722, and second coolant pump 732. In operation, controller 740 senses or receives a current coolant temperature ($Tc_i$) (at time i) within secondary coolant loop 731, and controls operation of fan(s) 733, as well as the amount of coolant flowing through liquid-to-air heat exchanger 730, and the amount of coolant flowing through ground-based heat sink 735, via the diverter valves 736, 734, respectively. One embodiment of control logic which may be implemented by controller 740 is depicted in FIGS. 12A-12B, and described further below.

As illustrated in FIG. 7, the ground-based heat sink 735 is disposed to operate as a pre-cooler to pre-cool coolant within secondary coolant loop 731 before reaching the economizer or liquid-to-air heat exchanger 730. By pre-cooling the coolant via the ground-based dissipation of heat, reduced energy is consumed by fan(s) 733, since the coolant is at a lower temperature when entering the liquid-to-air heat exchanger 730. Bypass (or diverter) valves $V_1$ 734 and $V_2$ 736 are located in fluid communication with the coolant loop and respective bypass lines upstream of the ground-based heat sink 735 and upstream of the economizer or liquid-to-air heat exchanger 730. These valves allow the controller to control the amount of coolant flowing through the liquid-to-air heat exchanger 730 and the amount of coolant flowing through the ground-based heat sink 735. In particular, the valves may be employed to allow coolant to partially or fully bypass the liquid-to-air heat exchanger, and if fully bypassing the liquid-to-air heat exchanger, to partially or fully bypass the heat sink as well. For example, coolant within secondary coolant loop 731 may need to bypass both the liquid-to-air heat exchanger and the ground-based heat sink when the coolant temperature ($Tc_i$) falls below a set, required temperature range for the coolant entering the liquid-to-liquid heat exchanger 720. In such a case, coolant temperature within the secondary coolant loop needs to be heated to rise to be within the required temperature range. As explained further below with reference to FIGS. 12A-12B, in one embodiment, assuming fan(s) 733 is off, the bypass valve 736 associated with the liquid-to-air heat exchanger 730 is first closed incrementally to increase temperature ($Tc_i$) of coolant within the secondary coolant loop, and once fully closed (meaning that coolant is bypassing the liquid-to-air heat exchanger 730), then bypass valve $V_1$ 734 associated with the ground-based heat sink 735 is incrementally closed to increase the temperature ($Tc_i$) of the coolant. These bypass diverter valves 736, 734 may need to be operated during winter months, depending upon the location of the cooling system. During summer, it is unlikely that both valves would be fully closed to divert coolant away from the associated heat exchange apparatuses.

In a typical data center such as described above in connection with FIGS. 1A & 1B, the electronic systems might consume about 50% of the total energy used within the data center, with cooling energy consumption associated with the data center being about 25%. Consequently, reducing power consumed in cooling a data center would be beneficial. In terms of cooling energy consumption, about one-half of the consumed power is by the refrigeration chiller-compressor, and about one-third is by the computer room air-conditioning units circulating cooled air, making these two components major contributors to data center energy consumption. In the embodiment of FIG. 7, a "chiller-less" cooling system is depicted, wherein the dissipated heat is rejected to ground and/or outdoor air, while still allowing for liquid cooling within the data center. The anticipated benefits to this approach include a significant energy savings at the data center level due to a significant reduction in cooling energy consumed, that is, compared with a conventional refrigeration-based cooling facility such as depicted in FIG. 1B.

In the approach of FIG. 7, there are primary and secondary coolant loops with (for instance) water being circulated through the primary loop within the data center to transport heat from, for example, one or more electronics racks to the liquid-to-liquid heat exchanger 720. Heat transferred to the coolant in the secondary coolant loop is then controllably rejected to the ground via the ground-based heat sink 735, and to outside air via the liquid-to-air heat exchanger 730. In warm weather months, the cooling system would typically be controlled to reject heat to both the ground and outside air, while in cold weather months, energy reduction is achieved by, for instance, by reducing the amount of coolant flowing through the liquid-to-air heat exchanger 730, and reducing speed of fan(s) 733, or turning the fan(s) off.

FIGS. 8A-11B depict various configurations of a heat sink, or more specifically, a ground-based heat sink, in accordance with one or more aspects of the present invention.

Generally stated, the heat sink includes, for instance, a housing having a compartment, a coolant inlet, and a coolant outlet. The housing is configured for a coolant to flow from the coolant inlet through the compartment to the coolant outlet, and the coolant transfers heat extracted from one or more electronic components. The heat sink further includes one or more heat pipes having a first portion disposed within the compartment of the housing and a second portion disposed outside of the housing. The heat pipe(s) is configured to extract heat from the coolant flowing through the compartment via, at least in part, convection to a working fluid in the first portion thereof, and to transfer the extracted heat to the second portion disposed outside of the housing. The second portion of the at least one heat pipe outside of the housing is configured to facilitate conducting the extracted heat to the ground. In operation, the first portion of the heat pipe is an evaporative region of the heat pipe, and the second portion comprises a condenser region of the heat pipe, wherein at least a portion of the condenser region resides within the ground.

Figure 8B:
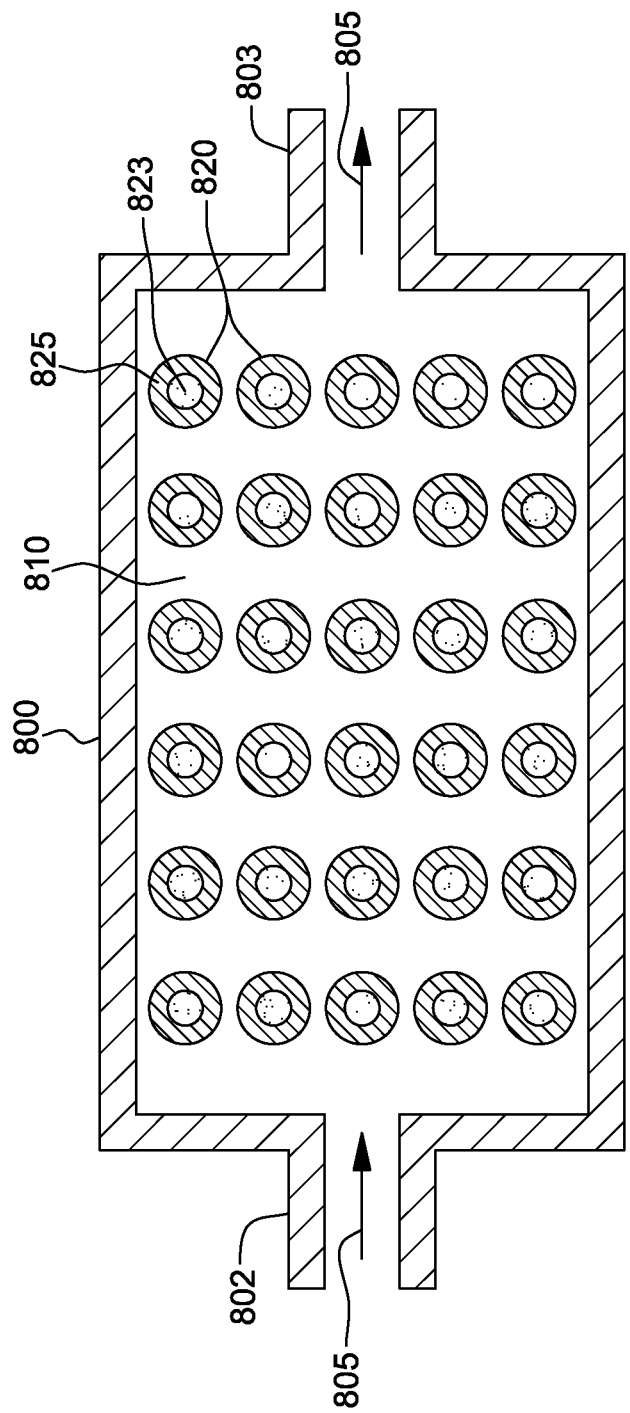
FIG. 8B is a cross-sectional plan view of one embodiment of the ground-based heat sink of FIG. 8A, taken along line 8B-8B in FIG. 8C, in accordance with one or more aspects of the present invention.
Figure 8C:
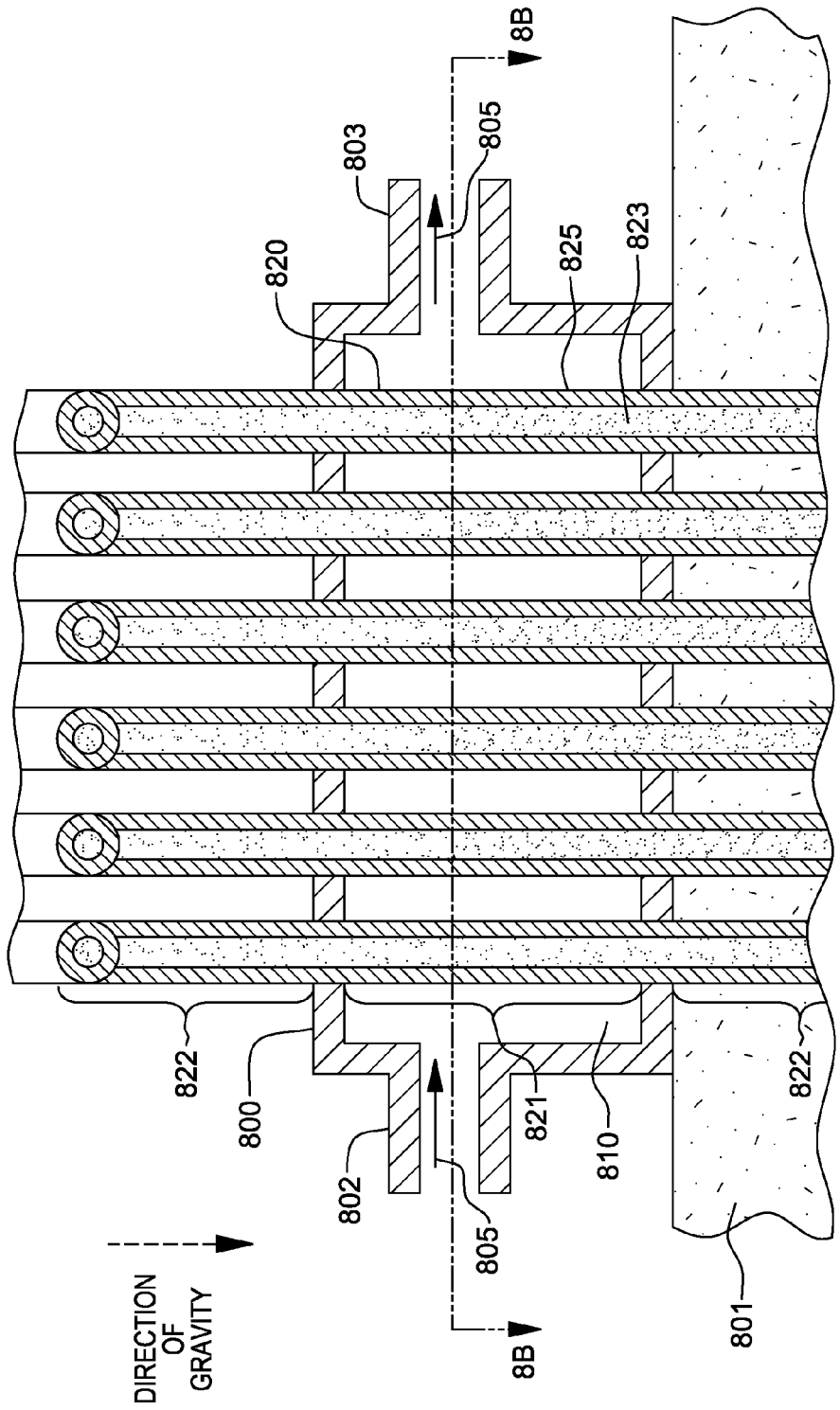
FIG. 8C is a partial cross-sectional elevational view of the ground-based heat sink of FIGS. 8A & 8B, taken along line 8C-8C in FIG. 8B, in accordance with one or more aspects of the present invention.

FIGS. 8A-8C illustrate one embodiment of a ground-based heat sink such as disclosed herein. Referring collectively to FIGS. 8A-8C, a housing 800, which is disposed aboveground 801, in this implementation, includes a compartment 810 with a coolant inlet 802 and a coolant outlet 803. Coolant 805 flows from the coolant inlet 802, through compartment 810, and exits via coolant outlet 803. As noted above, the ground-based heat sink is (in one embodiment) controllably coupled in fluid communication with a coolant loop, for example, such as secondary coolant loop 731 of the cooling system of FIG. 7.

In the heat sink embodiment of FIGS. 8A-8C, a plurality of heat pipes 820 are illustrated, associated with housing 800, and arrayed so as to pass in spaced relation through compartment 810 of housing 800. As illustrated in FIG. 8A, each heat pipe 820 is, in this embodiment, a looped heat pipe. By way of further example, and as explained below, each heat pipe 820 may be a tubular heat pipe with a working fluid vapor 823 and working fluid condensate 824 disposed within an outer tubular shell 825 of conductive material.

As illustrated in FIGS. 8A-8C, a first portion 821 of each heat pipe 820 resides within compartment 810 of housing 800, and a second portion 822, that is, the balance of the heat pipe, resides outside of housing 800, and (in this embodiment) is at least partially buried within ground 801. In operation, the first portions 821 of the heat pipes 820 are evaporative regions, and the second portions 822 of the heat pipes comprise condenser regions which are at least partially buried within ground 801 or otherwise disposed to transfer heat into the ground. In this implementation, working fluid vapor 823 flows in a downwards direction, as illustrated, from the evaporative regions of the heat pipes 820 within compartment 810, and condenses into working fluid condensate 824 (in this embodiment) within the condensing regions disposed (in this example) within ground 801. By extracting heat from coolant 805 passing through compartment 810, the heat pipes 820 cool the coolant, and in the embodiment of FIG. 7, pre-cool the coolant before the coolant passes through the economizer (i.e., liquid-to-air heat exchanger).

Within the condensing regions of the heat pipes, the heat is rejected to the surrounding ground, and the working fluid condensate 824 travels upwards to the upper portion of the continuous loops and then back down through the housing, and in particular, the compartment containing the coolant to be cooled. In this manner, heat is transferred first from the coolant to the heat pipes, and then from the heat pipes to ground. Note that looped heat pipes, such as illustrated in FIG. 8A, are commercially available, and can be designed to allow for the condenser region to be buried within the ground, and to be located lower than the evaporative region (that is, the heat absorption region), which means the liquid condensate has to travel back to the evaporator, against gravity. As illustrated, in this embodiment, the heat pipes form continuous loops around and through the housing of the heat dissipation apparatus. The loops may be of different size, as illustrated in FIG. 8A, in order to allow for the loops to spatially fit around each other and be arrayed in spaced relation when passing through the housing, as illustrated in FIGS. 8B & 8C.

Figure 9A:
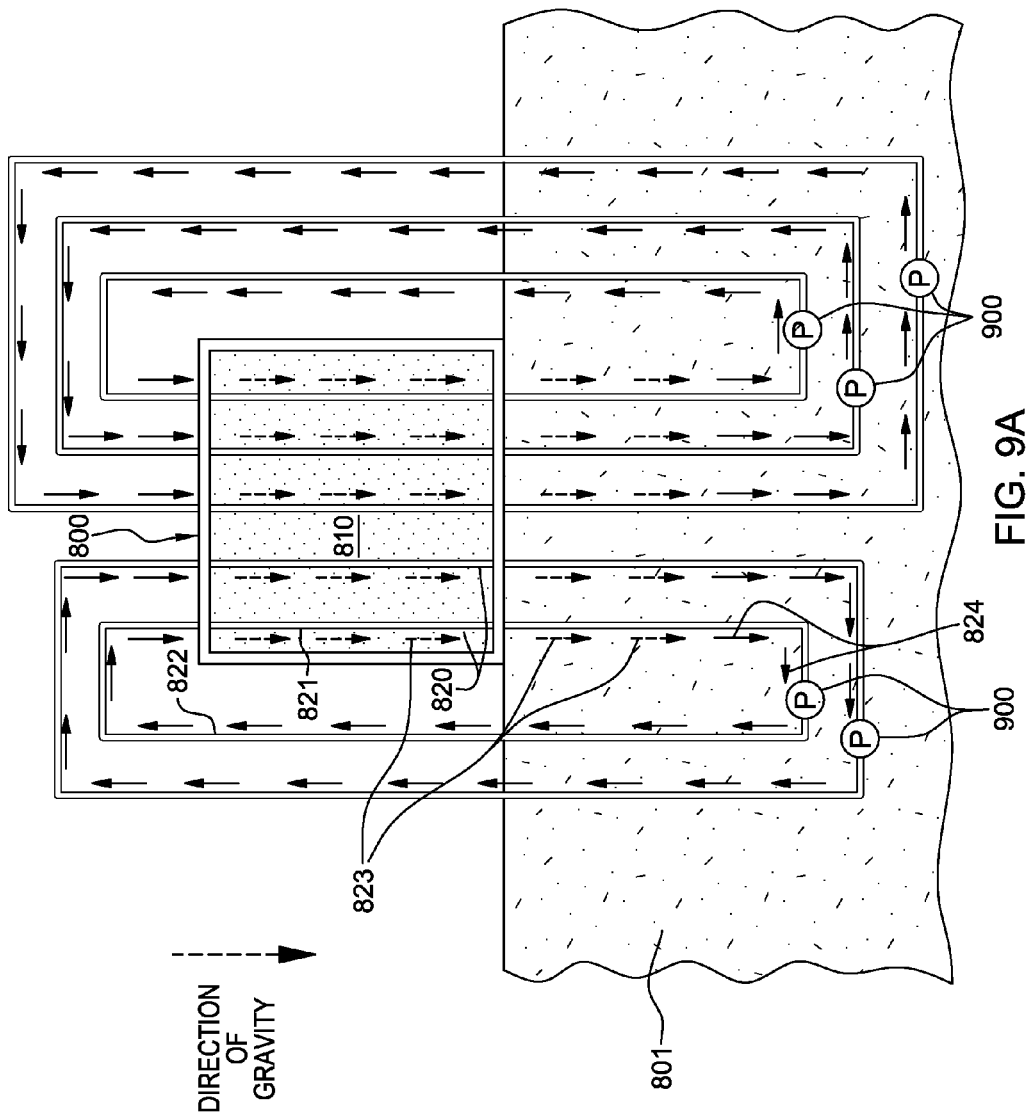
FIG. 9A is a schematic of another embodiment of a ground-based heat sink for a cooling system, for example, such as depicted in FIG. 7, in accordance with one or more aspects of the present invention.
Figure 9B:
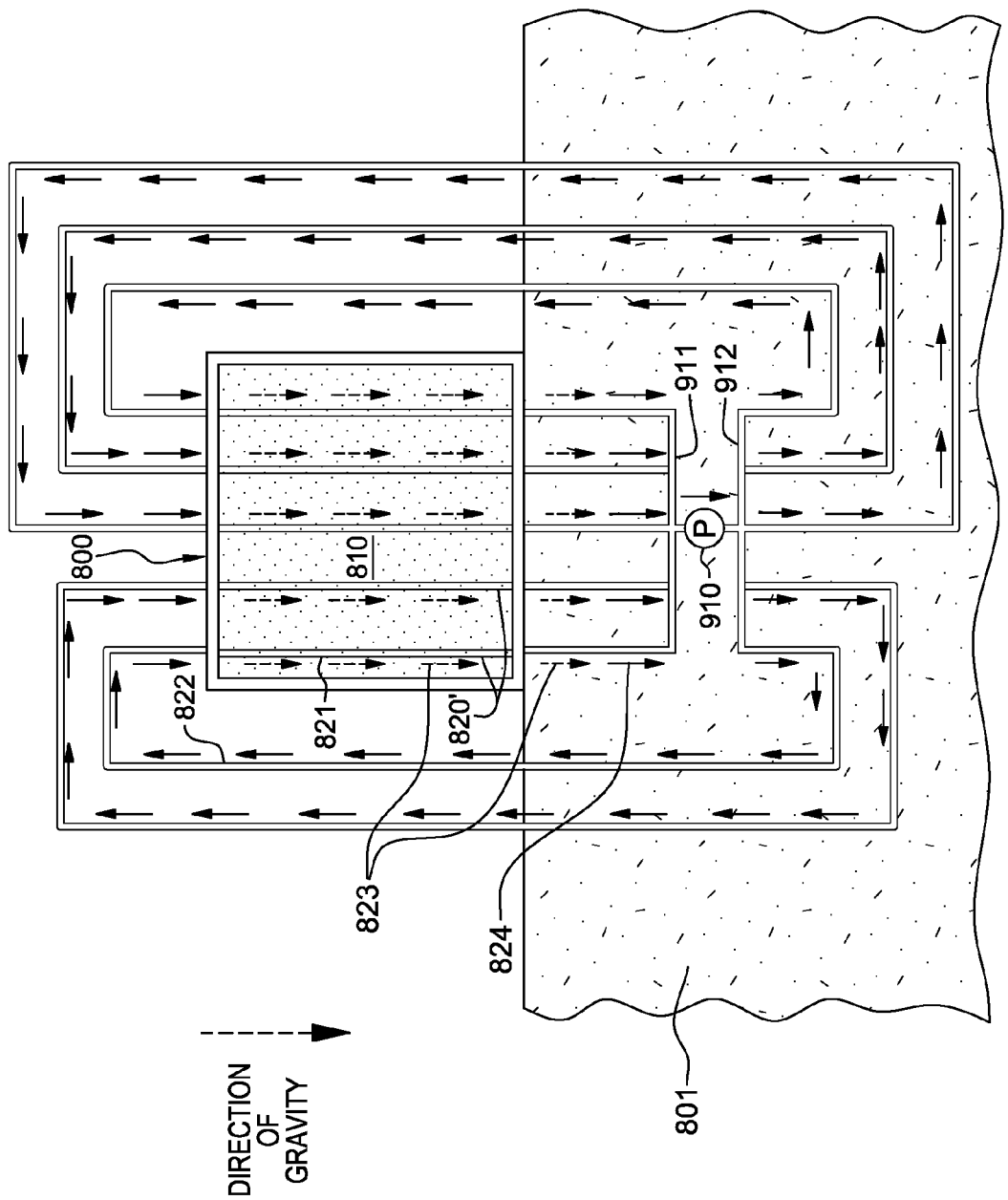
FIG. 9B is a schematic of a further embodiment of a ground-based heat sink for a cooling system, for example, such as depicted in FIG. 7, in accordance with one or more aspects of the present invention.

FIGS. 9A & 9B illustrate variations on the ground-based heat sink of FIGS. 8A-8C. In FIG. 9A, pumps 900 are added in fluid communication with the respective heat pipe(s) 820 to facilitate the return of working fluid condensate upwards against gravity. In this embodiment, pumps 900 are each located within the respective heat pipe loop to ensure that the pump is pumping working fluid condensate, that is, that the working fluid vapor has already condensed before reaching the pump. Note that, although illustrated as continuous loop heat pipes, each loop could alternatively comprise a respective straight heat pipe coupled in fluid communication with one or more working fluid transport lines disposed at least partially below-ground, and recirculating the condensate back to the first portion 821 of the heat pipe within the housing. In such an embodiment, each straight heat pipe may encompass at least the first portion, that is, the evaporative portion of the heat pipe disposed within the compartment 810 of housing 800. Note that as used herein, "heat pipe" includes such a hybrid configuration wherein the evaporative portion of the heat pipe is a conventional heat pipe structure, and at least part of the condenser portion is a liquid pipe or tube which functions as the condenser portion of the heat pipe. Note also that a "continuous loop heat pipe" as used herein, refers to a looped heat pipe, or a hybrid heat pipe configured in a loop, such as illustrated in FIG. 9A, or FIG. 9B.

FIG. 9B depicts a further embodiment of a ground-based heat sink, in accordance with one or more aspects of the present invention. As with the embodiment of FIG. 9A, this embodiment is substantially the same as that described above in connection with FIGS. 8A-8C. One difference from the embodiment of FIG. 9A, however, is that in FIG. 9B, the heat sink includes one or more common pumps 910 disposed (in this example) below-ground 801. A first, aggregating manifold 911 and a second, distributing manifold 912, are disposed upstream and downstream, respectively, of pump(s) 910 to facilitate the use of a common pump(s) to circulate working fluid condensate within the respective heat pipes 820'. Note that, other than the common pump(s), and aggregating and distributing manifolds 911, 912, separate looped heat pipes 820' are illustrated. These heat pipes are similar to those described above in that a first portion 821 of each heat pipe resides within compartment 810 of housing 800 and operates as an evaporative region of the heat pipe, and a second portion of the heat pipe resides outside the housing and includes a condensing region, which may be partially buried within ground 801. The first, aggregating manifold 911 is located below the condensing regions to ensure that the working fluid vapor has condensed before reaching the manifold, and thereby ensure that liquid condensate is supplied to pump(s) 910.

As with the implementation of FIG. 9A, the second portions 822 of the respective heat pipes 820', including the manifolds and pump lines coupling in fluid communication pump(s) 910 and the respective manifolds, may comprise liquid-carrying tubing which facilitates the return of the working fluid condensate back to first portions 821 of the respective heat pipes 820' within compartment 810. As used herein, a plurality of heat pipes 820' are depicted in FIG. 9B, since there are a plurality of first portions 821 of heat pipes 820' arrayed within compartment 810. As noted, in alternate embodiments, the condensing regions of the respective heat pipes may comprise extended portions of the respective straight heat pipes comprising the first, evaporative region, or may comprise liquid-carrying tubes, sized and configured to facilitate condensing and flow of the working fluid liquid back to the first portions 821 of the loops disposed within compartment 810.

FIGS. 10A-11B illustrate further examples of ground-based heat sinks, in accordance with one or more aspects of the present invention. These heat sinks are similar to the embodiments described above in connection with FIGS. 8A-9B, however, the entire housing is buried below-ground, which allows the dielectric fluid vapor within the respective heat pipes to rise, with working fluid condensate being returned along the side walls of the heat pipes. In one implementation, the heat pipes employed in the embodiments of FIGS. 10-11B may be conventional heat pipes with a cylindrical shape; that is, heat pipes which do not form a full loop, such as the looped heat pipes discussed above. In the embodiments of FIGS. 10A-11B, the housing is buried in the ground below the condenser regions of the heat pipes, which are also buried in the ground.

Figure 10A:
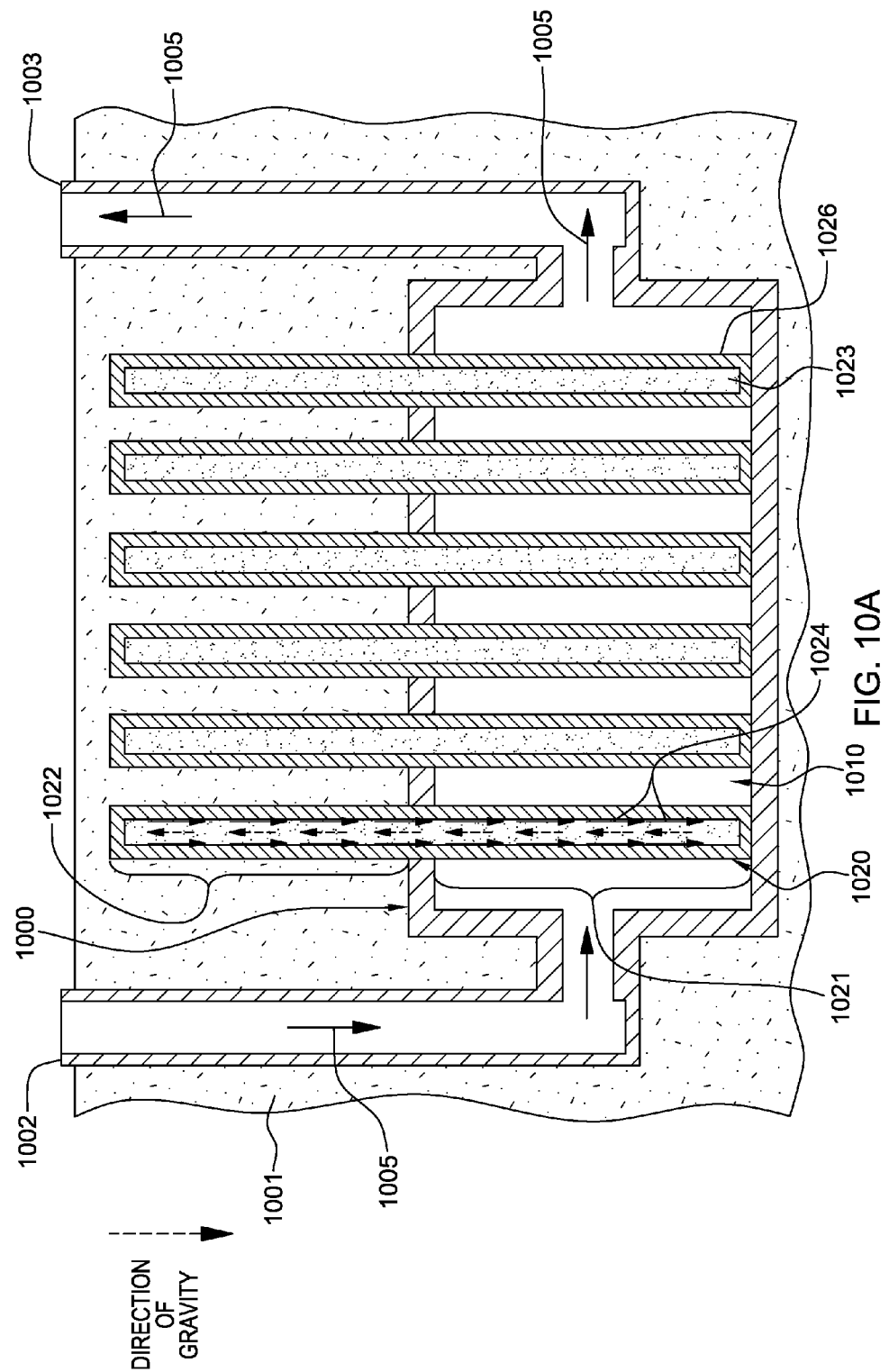
FIG. 10A is a cross-sectional elevational view of another embodiment of a ground-based heat sink for a cooling system, for example, such as depicted in FIG. 7, in accordance with one or more aspects of the present invention.

This is illustrated, for instance, in the heat sink example of FIG. 10A. In this embodiment, the heat sink includes a housing 1000 with a coolant inlet 1002, and a coolant outlet 1003 in fluid communication with a compartment 1010. As illustrated, the coolant inlet 1002 and coolant outlet 1003 include appropriately-sized tubing that allows the coolant 1005 to flow via the coolant inlet 1002 through the compartment 1010 and to exit via the coolant outlet 1003. As with the embodiments discussed above, the heat sink illustrated in FIG. 10A may be used in a cooling system, for example, such as in the cooling system described above in connection with FIG. 7. The heat sink further includes a plurality of heat pipes 1020, which include first portions 1021 disposed within compartment 1010, and second portions 1022 disposed outside of housing 1000, and (in this example) buried within ground 1001. As with the embodiments described above, the first portions operate as condenser regions of the heat pipes, wherein working fluid within the heat pipes evaporates. As noted, in this embodiment, the working fluid 1023 rises, and working fluid condensate 1024 from the condensing regions of the heat pipes, within the second portions of the heat pipes outside of the housing, falls back along the side walls 1026 of the heat pipes towards the first portions. Thus, extracted heat is transported by the working fluid vapor to the upper portion of each respective heat pipe, where the heat is transported to the neighboring ground, and working fluid condensate flows back downwards through the wicking material, to go back into the evaporative region of the heat pipe, that is, the first portion disposed within the compartment 1010.

Figure 10B:
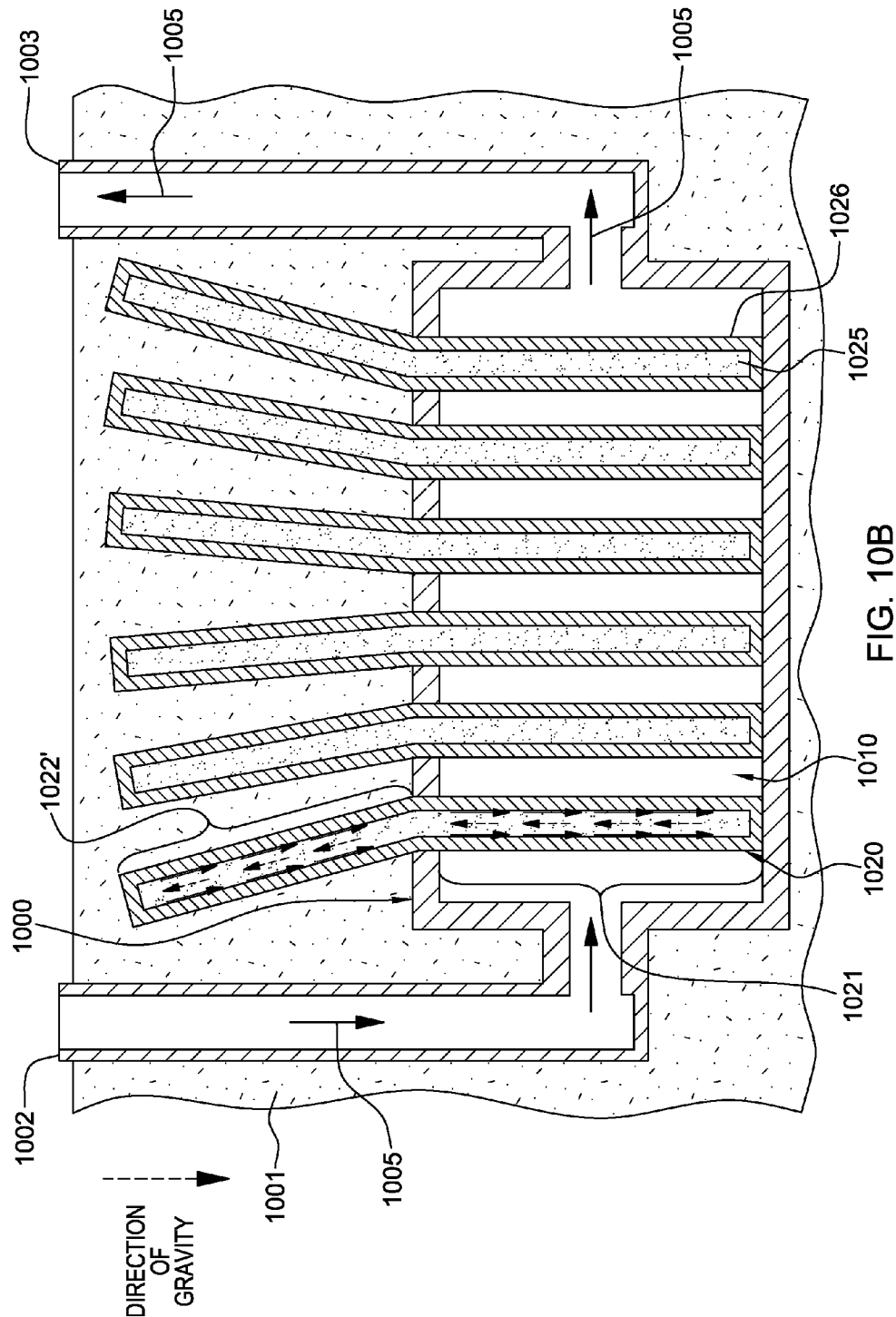
FIG. 10B is a cross-sectional elevational view of a further embodiment of a ground-based heat sink for a cooling system, in accordance with one or more aspects of the present invention.

The heat sink embodiment of FIG. 10B is similar to that of FIG. 10A, with the exception that the second portions 1022' of the respective heat pipes buried within ground 1001 are configured with bends to diverge away from each other outside of housing 1000. This configuration allows for slightly longer length heat pipes 1020 in the condenser region, and also allows for a greater volume of surrounding earth to which the heat pipes may reject extracted heat from the working fluid vapor.

Figure 11B:
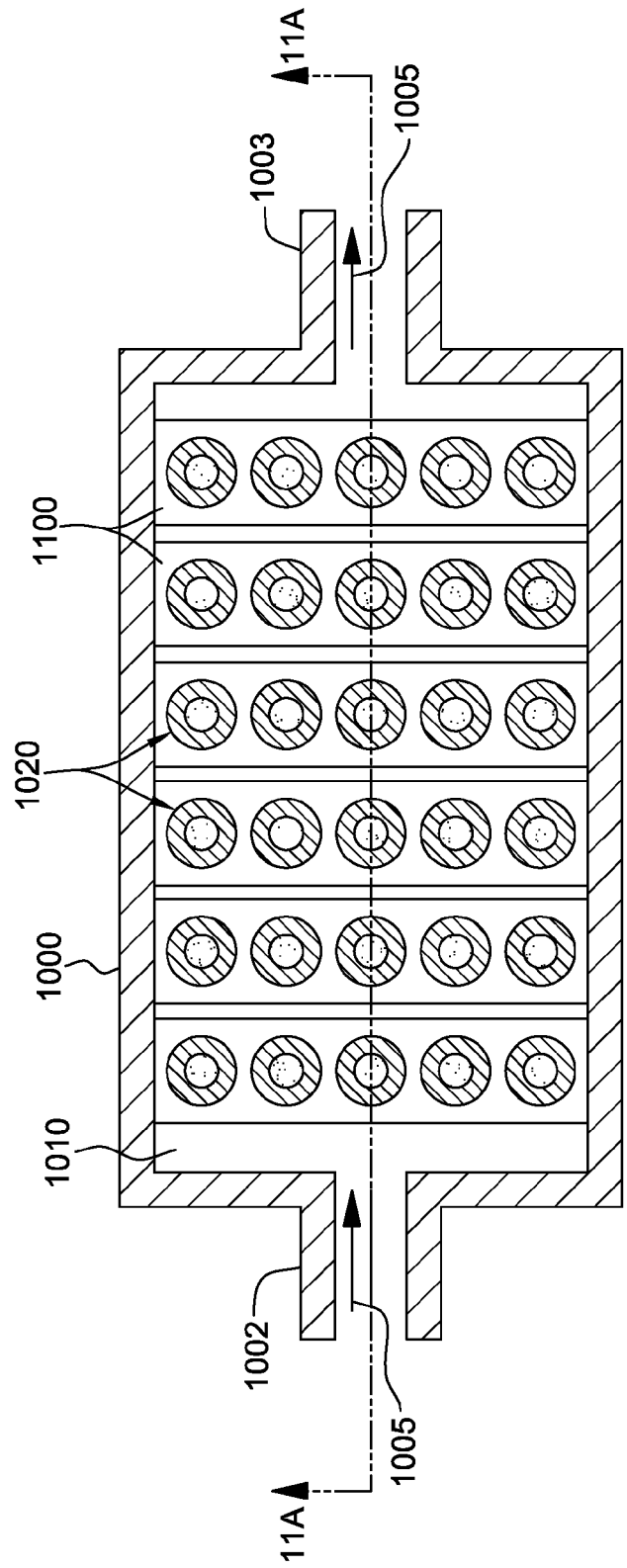
FIG. 11B is a cross-sectional plan view of the ground-based heat sink of FIG. 11A, taken along line 11B-11B thereof, in accordance with one or more aspects of the present invention.

FIGS. 11A & 11B also show a similar heat sink to that described above in connection with FIG. 10A. In this embodiment, the ground-based heat sink is again buried within the earth to, for instance, allow working fluid vapor to rise within the respective heat pipes, that is, to allow the condensing regions of the heat pipes to be buried within the ground above the housing containing the evaporative regions of the heat pipes. In this embodiment, a plurality of thermally conductive fins 1100, are attached to and extending from each heat pipe. By way of example, the plurality of thermally conductive fins 1100 may extend from the first portions 1021 of heat pipes 1020 within compartment 1010 to facilitate extraction of heat by the heat pipes from coolant 1005 flowing through compartment 1010. Note that as a further variation, thermally conductive fins could also extend from the second portions 1022 of heat pipes 1020 buried within the ground to provide larger heat transport surfaces from which to dissipate the extracted heat carried by the working fluid vapor rising within the heat pipes. In either case, the thermally conductive fins provide extended heat transfer surfaces, which may improve thermal performance of the heat dissipation apparatus.

FIGS. 12A & 12B depict one embodiment of a control process for a cooling system comprising a heat sink, a liquid-to-air heat exchanger (with an associated fan), and diverter valves and associated bypass lines, such as illustrated in FIG. 7, and described above. This control process may be employed with any ground-based heat sink, such as described herein, including those depicted in FIGS. 8A-11B, by way of example. Those skilled in the art should note that the control process of FIGS. 12A & 12B is presented by way of example only. The basic strategy of the process is to provide a required (i.e., desired) coolant temperature, for instance, to the cold side, that is, the coolant inlet side of liquid-to-liquid heat exchanger 720 from secondary coolant loop 731 in the cooling system example of FIG. 7. The process employs a minimum of external cooling resources, in terms of first coolant flowing only through the ground-based heat sink, and then in combination with coolant flow through the active economizer (i.e., the liquid-to-air heat exchanger) controllably coupled in series therewith, along with control of the active economizer fan.

At the start 1200 of the control process, the required coolant temperature ($Tc_{req'd}$) is initially determined or measured by, for instance, knowledge of the electronic system (e.g., IT rack) configuration in terms of the number of components, systems (e.g., servers), and anticipated heat load. In addition, an acceptable tolerance ($\in_{Tc}$) is selected about the required coolant temperature ($Tc_{req'd}$) to define a range of acceptable coolant temperatures 1202 at, for instance, the cold side inlet to the liquid-to-liquid heat exchanger in the cooling system embodiment of FIG. 7. Both diverter bypass valves $V_1$ and $V_2$ are set to full bypass 1204. In full bypass position, the diverter valves direct any coolant flow through the associated bypass line. That is, the respective diverter valve position $\theta$ is set to $\theta_{max}$, which is the full closed position, forcing the coolant flow through the associated bypass branch, and $\theta_{min}$ is the opposite extreme value position, wherein coolant is prevented from flowing through the associated bypass branch, and thus, is fully directed through the associated heat sink or liquid-to-air heat exchanger. Additionally, the coolant loop pump, for instance, pump 732 (FIG. 7) in secondary coolant loop 731, is turned on. At this point, coolant is only circulating through the pump and the liquid-to-liquid heat exchanger 720 in the example of FIG. 7. As coolant temperature ($Tc_i$) rises above the required value ($Tc_{req'd}$) 1206, processing will decrement diverter valve $V_1$ 1210 by setting $\theta_1 = \theta_1 - \Delta\theta$. That is, the diverter valve $V_1$ is actuated by $\Delta\theta$ from its full divert position so that a portion of the coolant flow pumped within the coolant loop will now pass through the heat sink. Note that as long as the monitored coolant temperature at the cold side input to the liquid-to-liquid heat exchanger remains within the acceptable temperature range, processing repeatedly waits time interval 1208 before again checking the monitored temperature.

Once the diverter valve $V_1$ begins to be adjusted 1210, processing waits a time t 1212 after each adjustment, before determining whether the monitored coolant temperature ($Tc_i$) is greater than the required coolant temperature ($Tc_{req'd}$)+the tolerance ($\in_{Tc}$) 1214. If "no", then processing determines whether the monitored temperature ($Tc_i$) is less than the required temperature ($Tc_{req'd}$) less the tolerance ($\in_{Tc}$) 1216. If "no" again, processing waits time t 1212 before re-evaluating the monitored temperature. If the temperature has dropped below the acceptable temperature range, then the diverter valve position is adjusted by $\Delta\theta$, that is, diverter valve $V_1$ position $\theta_1$ is set to equal $\theta_1+\Delta\theta$ 1220, after which, processing waits time t 1212 before again evaluating the monitored coolant temperature ($Tc_i$), for instance, at the liquid-to-liquid heat exchanger. Assuming that the monitored coolant temperature $Tc_i$ exceeds the acceptable temperature range, that is, temperature $Tc_i$ is greater than the required temperature ($Tc_{req'd}$) plus the tolerance ($\in_{Tc}$) 1214, then processing determines whether the diverter valve $V_1$ position is at a minimum ($\theta_{min}$) 1222. If "no", processing returns to decrement diverter valve $V_1$ by $\Delta\theta$ 1210 so as to direct additional coolant flow through the heat sink, for instance, heat sink 735 (FIG. 7). As long as the monitored coolant temperature $Tc_i$ is within the acceptable range (defined by $Tc_{req'd}+/-\in_{Tc}$), diverter valve $V_2$ will remain in the full divert position, and coolant flow will bypass the active economizer (i.e., the liquid-to-air heat exchanger 730, in this example). When the required coolant temperature ($Tc_{req'd}$) plus the tolerance ($\Delta\theta$) cannot be met by manipulating only the position of the diverter valve $V_1$, then diverter valve $V_2$ will begin to move towards its $\theta_{mine}$ position, allowing more and more of the coolant flow through the active economizer, and less through the associated bypass line. In particular, if diverter valve $V_1$ is set to a minimum position 1222, then diverter valve $V_2$ is adjusted by decrementing the position of that valve ($\theta_2=\theta_2-\Delta\theta$) 1224, after which, processing waits a time interval t 1226, before determining whether the current coolant temperature ($Tc_i$) is greater than the required coolant temperature ($Tc_{req'd}$) plus the accepted tolerance ($\in_{Tc}$) 1230. If "no", then processing determines whether the monitored coolant temperature ($Tc_i$) is less than the required temperature ($Tc_{req'd}$) less the accepted tolerance ($\in_{Tc}$) 1232. If "no" again, that is, the monitored coolant temperature is within the acceptable range, processing returns to wait time interval t 1226 before determining whether the coolant temperature at the cold side input to the liquid-to-liquid heat exchanger has moved outside the accepted range. If the coolant temperature is below the accepted range, then processing determines whether the position $\theta_2$ of diverter valve $V_2$ is set to maximum 1234. If "no", then diverter valve $V_2$ position $\theta_2$ is adjusted upwards 1236 to divert more coolant through the associated bypass line, after which processing waits time interval t 1238 before again determining whether the current coolant temperature ($Tc_i$) is below the accepted range 1232. If diverter valve $V_2$ position $\theta_2$ is set to maximum 1234, meaning that all coolant flow is bypassing the liquid-to-air heat exchanger 730 (FIG. 7) in this example, then processing increments diverter valve $V_1$ to bypass a portion of the coolant from going through the ground-based heat sink 735 (FIG. 7).

Returning to inquiry 1230, if processing determines that the monitored coolant temperature ($Tc_i$) is greater than the specified range 1230, then a determination is made whether diverter valve $V_2$ position $\theta_2$ is at the minimum ($\theta_{min}$), meaning that substantially all coolant flow is directed through the liquid-to-air heat exchanger 1240. If "no", then diverter valve $V_2$ is decremented ($\theta_2=\theta_2-\Delta\theta$) 1242, after which processing waits time interval t 1244 before again checking the coolant temperature to determine whether it is above the desired set point range 1230. As diverter valve $V_2$ reaches its minimum position, all coolant flow will be passing through the ground-based heat sink, as well as the active economizer (i.e., the liquid-to-air heat exchanger in this example). If under these conditions, the required coolant temperature ($Tc_{req'd}$) plus the tolerance ($\in_{Tc}$) is not being met, then processing proceeds to control the fan associated with the active economizer (that is, the liquid-to-air heat exchanger).

As illustrated in FIG. 12B, once determining that diverter valve $V_2$ is fully closed, processing waits time t 1250, before again evaluating the current coolant temperature ($Tc_i$), that is, before determining whether the current coolant temperature exceeds the required temperature ($Tc_{req'd}$) plus the accepted tolerance ($\in_{Tc}$) 1252. If "no", then processing determines whether the monitored coolant temperature ($Tc_i$) is less than the accepted temperature range defined by the required temperature ($Tc_{req'd}$) less the accepted tolerance ($\in_{Tc}$) 1254. If "no" again, processing returns to wait time interval t 1250 before again evaluating the coolant temperature at the cold side input to the coolant buffer (i.e., the liquid-to-liquid heat exchanger). If temperature is below the defined range, then processing determines whether the speed of the fan is set to a minimum RPM 1256 (e.g., is off). In this condition, active control using fan operation is no longer needed, and processing returns to the flow of FIG. 12A to wait time interval t 1226. However, if the fan speed is not at a minimum, then processing adjusts the fan's RPMs downwards 1258, before waiting time interval t 1260, and again determining whether the current coolant temperature ($Tc_i$) is less than the set temperature range.

Assuming that the monitored temperature ($Tc_i$) is greater than the set temperature range, then processing begins to ramp up the fan speed from an initially low RPM setting to a higher value, providing greater cooling capacity via the active economizer. Initially, processing determines whether the fan speed is at a maximum 1262, and if the fan speed has reached maximum RPMs, and the required coolant temperature is still not met, a message is initiated that cooling is at its maximum capacity 1264. Although not illustrated, action could also automatically be taken to lower the rack heat load by, for example, degrading system (e.g., server) performance until, for instance, the outside air temperature drops, and a higher heat load can be accommodated. Assuming that the fan speed it not at its maximum, then the fan speed is increased 1266, after which processing waits time interval t 1250 before again determining whether the monitored coolant temperature is above the accepted temperature range defined by the required temperature ($Tc_{req'd}$)+/-the accepted tolerance ($\in_{Tc}$).

As will be appreciated by one skilled in the art, one or more control aspects of the present invention may be embodied as a system, method or computer program product. Accordingly, one or more control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 13:
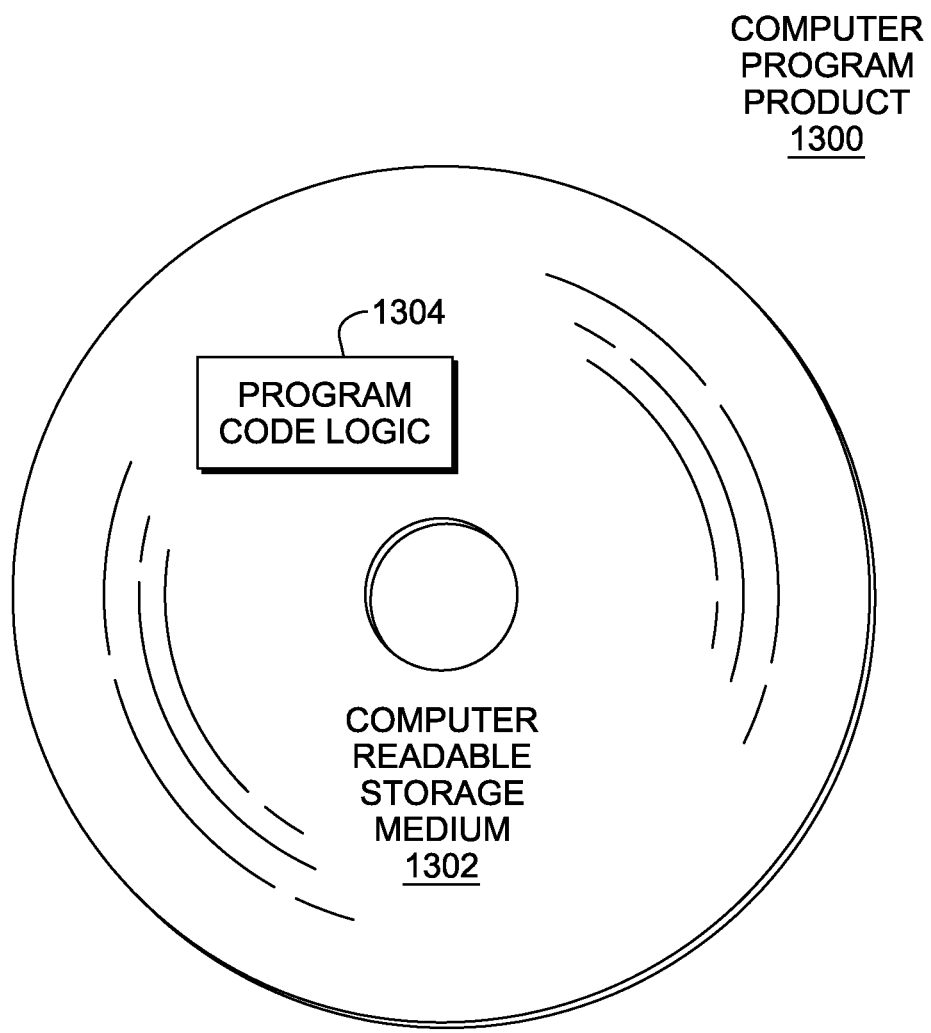
FIG. 13 depicts one embodiment of a computer program product incorporating one or more aspects of the present invention.

Referring now to FIG. 13, in one example, a computer program product 1300 includes, for instance, one or more non-transitory computer readable storage media 1302 to store computer readable program code means or logic 1304 thereon to provide and facilitate one or more control aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more control aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more control aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more control aspects of the present invention may be provided, offered, deployed, managed, serviced, etc. by a service provider who offers management of customer environments. For instance, the service provider can create, maintain, support, etc. computer code and/or a computer infrastructure that performs one or more control aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more control aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing a coolant loop;
   providing a ground-based heat sink controllably coupled to the coolant loop, the ground-based heat sink comprising:
      a housing including a compartment, a coolant inlet, and a coolant outlet, the housing being configured for a coolant to flow from the coolant inlet through the compartment to the coolant outlet, the coolant transferring heat extracted from one or more electronic components; and
      at least one heat pipe comprising a first portion disposed within the compartment of the housing and a second portion disposed outside the housing, the at least one heat pipe being configured to extract heat from the coolant flowing through the compartment and to transfer the extracted heat to the second portion disposed outside of the housing, wherein the second portion of the at least one heat pipe outside the housing facilitates conducting the extracted heat to the ground;
   providing a heat rejection unit controllably coupled to the coolant loop, the heat rejection unit configured to reject heat from coolant passing therethrough to air passing across the heat rejection unit;
   providing a controller coupled to control flow of coolant within the coolant loop through the ground-based heat sink and through the heat rejection unit based, at least in part, on at least one monitored variable;
   wherein the ground-based heat sink and the heat rejection unit are controllably coupled to the coolant loop in series, the ground-based heat sink being coupled to the coolant loop upstream of the heat rejection unit and the coolant passes through the ground-based heat sink before passing through the heat rejection unit, and the controller is configured to automatically control flow of coolant within the coolant loop through the ground-based heat sink based, at least in part, on the at least one monitored variable, and to automatically control flow of coolant within the coolant loop through the heat rejection unit based, at least in part, on the at least one monitored variable;
   providing a first bypass line and a first diverter valve coupled to the coolant loop between the ground-based heat sink and the heat rejection unit, the controller automatically controlling the first diverter valve to control an amount of coolant to pass through the heat rejection unit based, at least in part, on the at least one monitored variable, the controller allowing the coolant to pass through or preventing the coolant from passing through the heat rejection unit by control of the first diverter valve; and
   providing a second bypass line and a second diverter valve coupled to the coolant loop upstream of the ground-based heat sink, the controller automatically controlling the second diverter valve to control an amount of coolant to pass through the ground-based heat sink based, at least in part, on the at least one monitored variable, the controller allowing the coolant to pass through the ground-based heat sink or preventing the coolant from passing through both the ground-based heat sink and the heat rejection unit by control of the second diverter valve.

2. The method of claim 1, wherein the housing with the compartment resides below-ground and, in operation, a working fluid vapor rises within the at least one heat pipe from the evaporative region to the condenser region thereof.

3. The method of claim 2, wherein the heat sink comprises a plurality of heat pipes, each heat pipe of the plurality of heat pipes comprising a first portion disposed within the compartment of the housing and a second portion disposed outside of the housing, and each heat pipe being configured to extract heat in an evaporative region of the first portion from the coolant flowing through the compartment and to transfer the extracted heat to the second portion of the heat pipe disposed outside the housing, wherein the second portion of the heat pipe outside the housing is configured with a condenser region at least partially buried within the ground to facilitate conducting the extracted heat to the ground.

4. The method of claim 1, further comprising providing an adjustable fan associated with the heat rejection unit for facilitating moving air across the heat rejection unit and thereby controlling rejection of heat from the coolant passing through the heat rejection unit to the air passing across the heat rejection unit, the controller controlling speed of the adjustable fan based on, at least in part, the at least one monitored variable.

5. The method of claim 4, wherein the controller automatically controls operation of the adjustable fan, the amount of coolant passing through the heat rejection unit, and the amount of coolant passing through the ground-based heat sink to maintain a monitored variable of the at least one monitored variable within a set range.

6. The method of claim 1, wherein the coolant loop is a secondary coolant loop and the method further comprises:
  providing a primary coolant loop distinct from the secondary coolant loop, the primary coolant loop facilitating removal of heat from one or more electronic systems; and
  providing a liquid-to-liquid heat exchanger, the liquid-to-liquid heat exchanger being coupled in fluid communication with both the primary coolant loop and the secondary coolant loop, and the liquid-to-liquid heat exchanger facilitating transfer of heat from the primary coolant loop to the secondary coolant loop.

* * * * *